United States Patent
Qu et al.

(10) Patent No.: US 8,537,787 B2
(45) Date of Patent: Sep. 17, 2013

(54) SYSTEM AND METHOD FOR MAPPING AND DECODING CODEWORDS IN ACKNOWLEDGEMENT INFORMATION COMMUNICATIONS

(75) Inventors: Bingyu Qu, Schaumburg, IL (US); Yufei Blankenship, Kildeer, IL (US)

(73) Assignee: FutueWei Technologies, Inc., Plano, TX (US)

( * ) Notice: Subject to any disclaimer, the term of this patent is extended or adjusted under 35 U.S.C. 154(b) by 257 days.

(21) Appl. No.: 13/023,338

(22) Filed: Feb. 8, 2011

(65) Prior Publication Data

US 2011/0268090 A1  Nov. 3, 2011

Related U.S. Application Data

(60) Provisional application No. 61/328,905, filed on Apr. 28, 2010, provisional application No. 61/370,602, filed on Aug. 4, 2010.

(51) Int. Cl.
*H04B 7/216* (2006.01)
(52) U.S. Cl.
USPC .......................................... 370/335; 714/751
(58) Field of Classification Search
USPC .......................................... 370/335; 714/751
See application file for complete search history.

(56) References Cited

U.S. PATENT DOCUMENTS

| | | | | |
|---|---|---|---|---|
| 5,870,414 | A * | 2/1999 | Chaib et al. | 714/792 |
| 2009/0199063 | A1 * | 8/2009 | Chun et al. | 714/749 |
| 2010/0329197 | A1 * | 12/2010 | Boariu et al. | 370/329 |

OTHER PUBLICATIONS

"3rd Generation Partnership Project; Technical Specification Group Radio Access Network; Evolved Universal Terrestrial Radio Access (E-UTRA); Multiplexing and Channel Coding (Release 8)," 3GPP TS 36.212, V8.5.0, Dec. 2008, 58 pages.
"3rd Generation Partnership Project; Technical Specification Group Radio Access Network; Multiplexing and Channel Coding (TDD) (Release 6)," 3GPP TS 25.222, V6.3.0, Mar. 2009, 67 pages.
Ericsson, "A/N transmission in the uplink for carrier aggregation," 3GPP TSG-RAN WG1 #60, R1-100909, Feb. 22-26, 2010, 4 pages, San Francisco, USA.
Ericsson, "On ACK/NACK codebook performance for carrier aggregation," 3GPP TSG-RAN WG1 #60bis, R1-101787, Apr. 12-16, 2010, 19 pages, Beijing China.

\* cited by examiner

*Primary Examiner* — Andrew Lai
*Assistant Examiner* — Sumitra Ganguly
(74) *Attorney, Agent, or Firm* — Slater & Matsil, L.L.P.

(57) ABSTRACT

A system and method for mapping and decoding codewords in acknowledgement information communications are provided. A method for communications device operations includes determining a hybrid automatic repeat request (HARQ) response for each component carrier (CC) in a set of configured CCs, thereby producing a set of HARQ responses, generating an information vector from the set of HARQ responses, encoding the information vector based on a (n, k) linear block code corresponding to the set of configured CCs, and transmitting the encoded information vector. A unique set of bits selected from the information vector is assigned to represent a HARQ response for each different CC in the set of configured CCs. The (n, k) linear block code is obtained by a linear transformation of an original (n, k) linear block code, where n is a length of code words, and k is a length of information vectors.

22 Claims, 7 Drawing Sheets

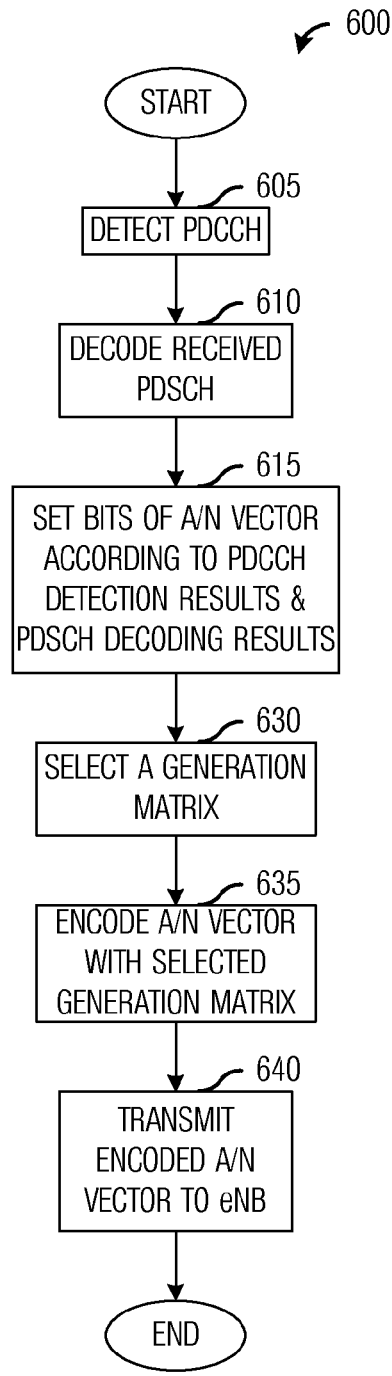
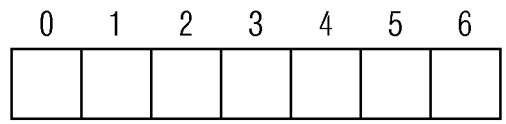
*Fig. 7a*
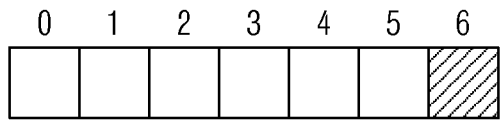
*Fig. 7b*
*Fig. 6*

A US 8,537,787 B2

SYSTEM AND METHOD FOR MAPPING AND DECODING CODEWORDS IN ACKNOWLEDGEMENT INFORMATION COMMUNICATIONS

This application claims the benefit of U.S. Provisional Applications 61/328,905, filed Apr. 28, 2010, entitled "Methods and Equipments of Mapping and Decoding Codewords for Acknowledge Information;" and 61/370,602, filed Aug. 4, 2010, entitled "Methods and Equipments of Mapping and Decoding Codewords for Acknowledge Information," which applications are hereby incorporated herein by reference.

TECHNICAL FIELD

The present invention relates generally to wireless communications, and more particularly to a system and method for mapping and decoding codewords in acknowledgement information communications.

BACKGROUND

Generally, in a wireless communications system, such as a Third Generation Partnership Project (3GPP) Long Term Evolution (LTE) compliant communications system, there are physical data channels and physical control channels. The physical control channels may convey information to assist data communications, which occur over the physical data channels.

FIG. 1 illustrates a communications system 100. Communications system 100 may be a 3GPP LTE compliant communications system. Communications system 100 includes an enhanced NodeB (eNB) 105, which may also be commonly referred to as a base station, base transceiver station, controller, communications controller, and so forth. eNB 105 may control communications to and from a user equipment (UE) 110. UE 110 may also be referred to as a mobile station, terminal, user, subscriber, and so on. Communications from eNB 105 to UE 110 may occur over a downlink (DL) channel, while communications from UE 110 to eNB 105 may occur over an uplink (UL) channel.

A hybrid automatic repeat request (HARD) mechanism is a mechanism in a 3GPP LTE compliant communications system that allows a transmitter of a data packet (e.g., an eNB) to retransmit the data packet if a receiver of the data packet (e.g., a UE) fails to decode it. The eNB may add a cyclic redundancy code (CRC) to a transport block and transmit the data packet. Upon receipt, the UE may attempt to decode the data packet. If the data packet passes CRC check, then the UE may feed back an acknowledgement (represented as ACK or A) to the eNB. If the data packet fails CRC check, then the UE may feed back a negative acknowledgement (represented as NACK or N) to the eNB. If the eNB receives a NACK, the eNB may retransmit the data packet.

If the UE fails to locate a transmission intended for it, the UE may feed back a discontinuous transmission (represented as DTX) to the eNB. The DTX state may be fed back in a manner that the UE feeds back nothing (e.g., keep silent) to the eNB transmitter. If the eNB receives a DTX and if the eNB transmitted a data packet that corresponds to the DTX from the UE, the eNB may retransmit the data packet. However, if the eNB receives a DTX from the UE and it did not make a transmission to the UE, then the eNB may chose to not respond to the DTX.

FIG. 2 illustrates a prior art physical channel structure of a 3GPP LTE compliant communications system. As discussed previously, communications systems communicate over a DL channel (shown in FIG. 2 as channel 205) and an UL channel (shown in FIG. 2 as channel 210).

In a 3GPP LTE compliant communications system, multiple channels may be multiplexed over a single set of physical channel resource(s). Both control signaling and data may be carried over a single set of network resources. As shown in DL channel 205, control signaling may be carried in a first portion of network resources (shown as physical downlink control channel (PDCCH)) and data may be carried in a second portion of network resources (shown as physical downlink shared channel (PDSCH)). The PDCCH may include indications of network resources assigned to UEs. For example, indicator 215 may be an indication to network resources 216 assigned to a first UE, and indicator 218 may be an indication to network resources 219 assigned to a second UE, and so forth. In general, a UE detects its PDCCH and then determines a location of network resources allocated to it by the eNB and detects data transmitted to it at the location of the network resources. If the UE fails to detect its PDCCH, the UE cannot receive a transmission since it does not know where to locate the transmission. The UE may feed back a DTX to the eNB. If the eNB has not scheduled any transmissions to the UE, then there may not be a PDCCH intended for the UE.

UL channel 210 may be used to convey HARQ acknowledgements from the UEs in the 3GPP LTE compliant communications system, potentially with other information. As an example, network resources 225 may be used to convey HARQ acknowledgements from the first UE and network resources 226 may be used to convey HARQ acknowledgements from the second UE.

SUMMARY OF THE INVENTION

These and other problems are generally solved or circumvented, and technical advantages are generally achieved, by embodiments of the present invention which provide a system and method for mapping and decoding codewords in acknowledgement information communications.

In accordance with an embodiment of the present invention, a method for communications device operations is provided. The method includes determining a hybrid automatic repeat request (HARQ) response for each component carrier (CC) in a set of configured CCs, thereby producing a set of HARQ responses, generating an information vector from the set of HARQ responses, encoding the information vector based on a (n, k) linear block code corresponding to the set of configured CCs, and transmitting the encoded information vector. A unique set of bits selected from the information vector is assigned to represent a HARQ response for each different CC in the set of configured CCs. the (n, k) linear block code is obtained by a linear transformation of an original (n, k) linear block code, where n is a length of code words, and k is a length of information vectors.

In accordance with another embodiment of the present invention, a method for communications device operations is provided. The method includes decoding a received encoded information vector based on a generator matrix for a (n, k) linear block code, and generating individual hybrid automatic repeat request (HARQ) responses from the information vector. The encoded information vector includes a HARQ response for a previous data transmission from the communication device over a plurality of configured component carriers (CCs), wherein the decoding makes use of a priori information about a subset of CCs from a set of configured CCs used to transmit information from the communications device, thereby producing an information vector, and wherein the (n, k) linear block code is obtained by linear transformation of an original (n, k) linear block code, where n is a length of code words, and k is a length of information bit vector In accordance with another embodiment of the present invention, a communications device is provided. The communications device includes a response unit, a mapper coupled to the response unit, and an encoder coupled to the mapper. The response unit determines a hybrid automatic repeat request (HARQ) response for each transport block (TB) of each component carrier (CC) in a set of configured CCs assigned to the communications device, and the mapper generates an information vector from HARQ responses produced by the response unit and the set of configured CCs, where a unique set of bits selected from the information vector is assigned to represent HARQ response for each different CC in the set of configured CCs. The encoder encodes the information vector based on a generator matrix for a (n, k) linear block code, which is obtained by linear transformation of an original (n, k) linear block code, where n is a length of code words, and k is a length of information bit vector.

In accordance with another embodiment of the present invention, a communications device is provided. The communications device includes a decoder, a generator coupled to the decoder, and a processor coupled to the generator. The decoder is coupled to an information source, and decodes an encoded information vector provided by the information source based on a (n, k) linear block code, wherein the (n, k) linear block code is obtained from an original (n, k) linear block code, where n is a length of code words, and k is a length of information bit vector. The decoder makes use of a priori information about a subset of component carriers (CCs) used to transmit information. The generator produces individual hybrid automatic repeat requested (HARQ) responses from an output of the decoder, and the processor processes each of the individual HARQ responses.

In accordance with another embodiment of the present invention, a method for communications device operations is provided. The method includes generating an information vector that represents a hybrid automatic repeat requested acknowledgement (HARQ-ACK) response of transport blocks on each configured component carrier, encoding the information vector, and transmitting the encoded information vector. Two information bits are used to represent the HARQ-ACK response of a single transport block, and the encoding is based on two linear block codes. The two information bits used to represent the HARQ-ACK response of a single transport block are obtained by mapping an acknowledgement/ negative acknowledgement (ACK/NACK) state of a single transport block into two ACK/NACK states selected from a set of ACK/NACK states for dual transport blocks, wherein the ACK/NACK state of a single transport block comprises {ACK or NACK} states, and wherein the set of ACK/NACK states for dual transport blocks comprises {(ACK, ACK), (ACK, NACK), (NACK, ACK), (NACK, NACK)}, and wherein an ACK state is mapped into (ACK, ACK) and a NACK state is mapped into (NACK, NACK), and the two information bits corresponding to a component carrier are encoded with separate linear block codes.

An advantage of an embodiment is that regardless of which vectors are expurgated in the generator matrices of the linear block code when only a subset of CCs in a configured set of CCs or a single transport block per CC are scheduled, the performance fluctuation of ACK/NACK feedback transmission is avoided or reduced, thereby resulting in relatively stable performance.

A further advantage of an embodiment is that dynamically switching between one transport block and two transport blocks can be supported with relatively better performance when single transport blocks are scheduled.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 6 is a flow diagram of UE operations in transmitting ACK/NACK information to an eNB;
FIGS. 7a and 7b are diagrams of an ACK/NACK information vector with and without a bit set to a fixed value.

DETAILED DESCRIPTION OF ILLUSTRATIVE EMBODIMENTS

The making and using of the current embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a 3GPP LTE-Advanced (LTE-A) compliant communications system that supports component carriers. The invention may also be applied, however, to other communications systems, such as WiMAX compliant communications systems, that support the use of multiple carriers to convey transmissions to a single user and an aggregation of ACK/NACK responses onto a single channel.

In a 3GPP LTE-A compliant communications system, support for greater bandwidth through carrier aggregation is provided. Generally, in carrier aggregation, two or more component carriers (CC), with each having a bandwidth of up to 20 MHz, may be aggregated. A maximum of five CCs may be aggregated for a total bandwidth of up to 100 MHz.

In a 3GPP LTE compliant communications system, DL spatial multiplexing of up to four multiple input, multiple output (MIMO) layers is supported, while up to eight MIMO layers are supported in a 3GPP LTE-A compliant communications system. In case of spatial multiplexing, up to two transport blocks (TB) may be transmitted to a scheduled UE in a subframe per DL CC. Correspondingly, for HARQ ACK/NACK operation in the UL, one UL ACK/NACK feedback is needed per DL TB.

Figure 1:
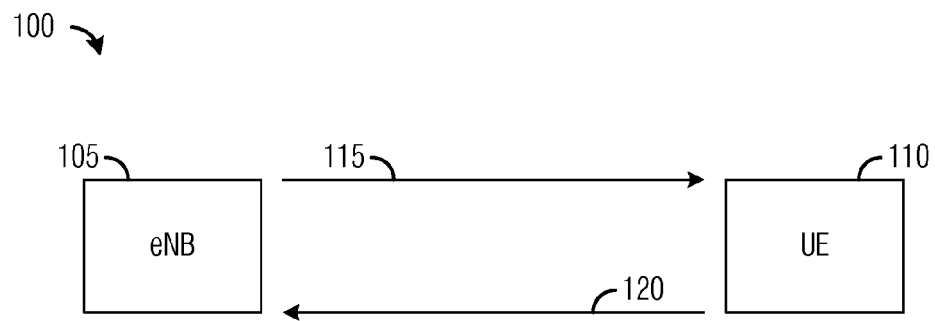
FIG. 1 is a diagram of a communications system.
Figure 2:
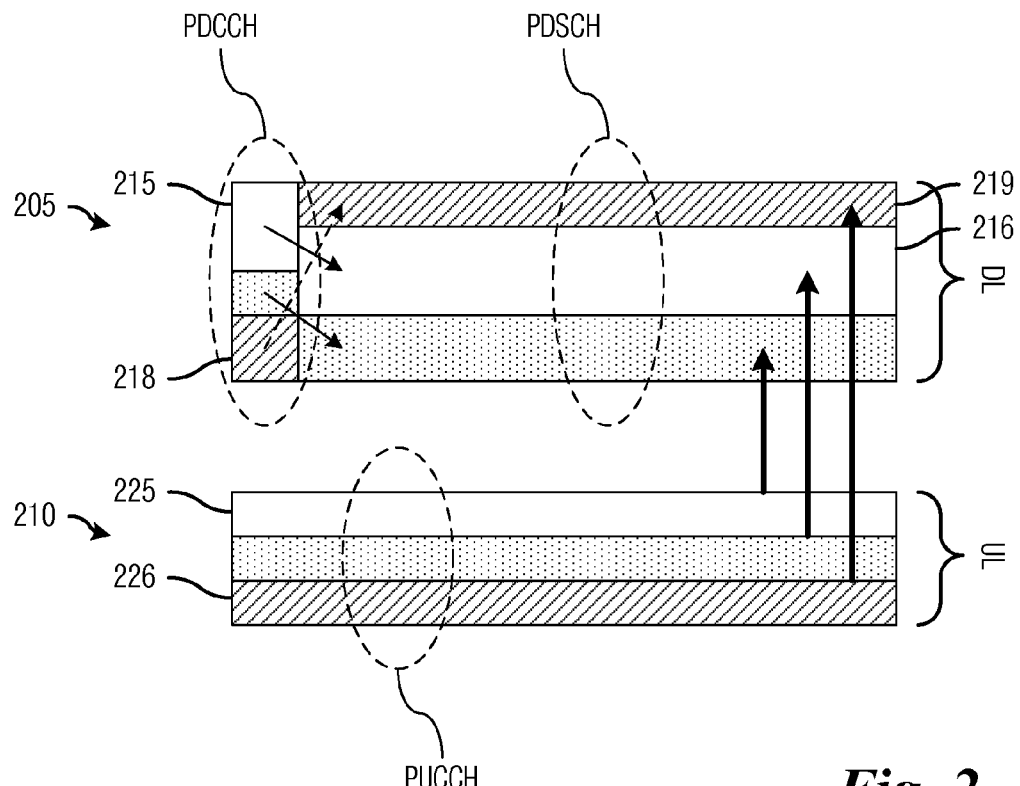
FIG. 2 is a diagram of a prior art physical channel structure of a 3GPP LTE compliant communications system.

In a 3GPP LTE-A compliant communications system, there may be an independent HARQ entity for each CC, which enables the HARQ processes of each CC to be implemented independently. Furthermore, there may be one PDCCH for each PDSCH located on each CC. The PDCCH may be located in the same CC as its corresponding PCSCH or may be in a different CC from its corresponding PDSCH (refer to FIG. 2 for an overview of the PDCCH and PCSCH). Accordingly, the ACK/NACK information corresponding to the TBs on each CC may be processed independently. If a UE has multiple DL CCs to receive transmitted data, then multiple simultaneous ACK/NACK feedbacks may be generated and transmitted to the eNB from the UE.

For a single CC with one TB, there may be a total of three states of the form (TB1):
  ACK
  NACK and
  DTX.

For a single CC with two TBs, there may be a total of five possible state two-tuples of the form (TB1, TB2):
  (ACK, ACK)
  (ACK, NACK)
  (NACK, ACK)
  (NACK, NACK) and
  DTX.

Figure 3A:
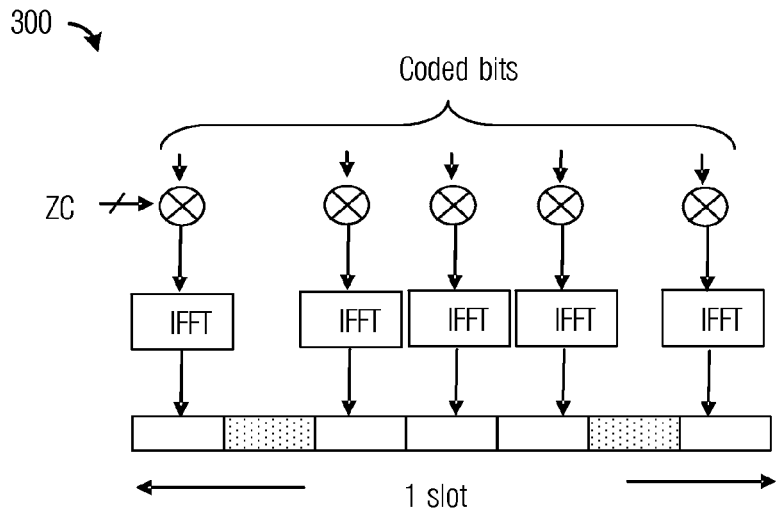
FIG. 3a is a diagram of a first technique for transmitting multiple ACK/NACK feedbacks.

FIG. 3a illustrates a technique 300 for transmitting multiple ACK/NACK feedbacks. As shown in FIG. 3a, technique 300 may reuse the PUCCH format #2 as described in the 3GPP LTE technical standards, wherein the UE separately modulates coded ACK/NACK information bits with Zadoff-Chu-like sequences, and places the modulated signals into multiple symbols in a single slot (one subframe comprises two slots). Technique 300 may be able to transmit up to 13 ACK/NACK information bits that are encoded into 20 coded bits.

Figure 3B:
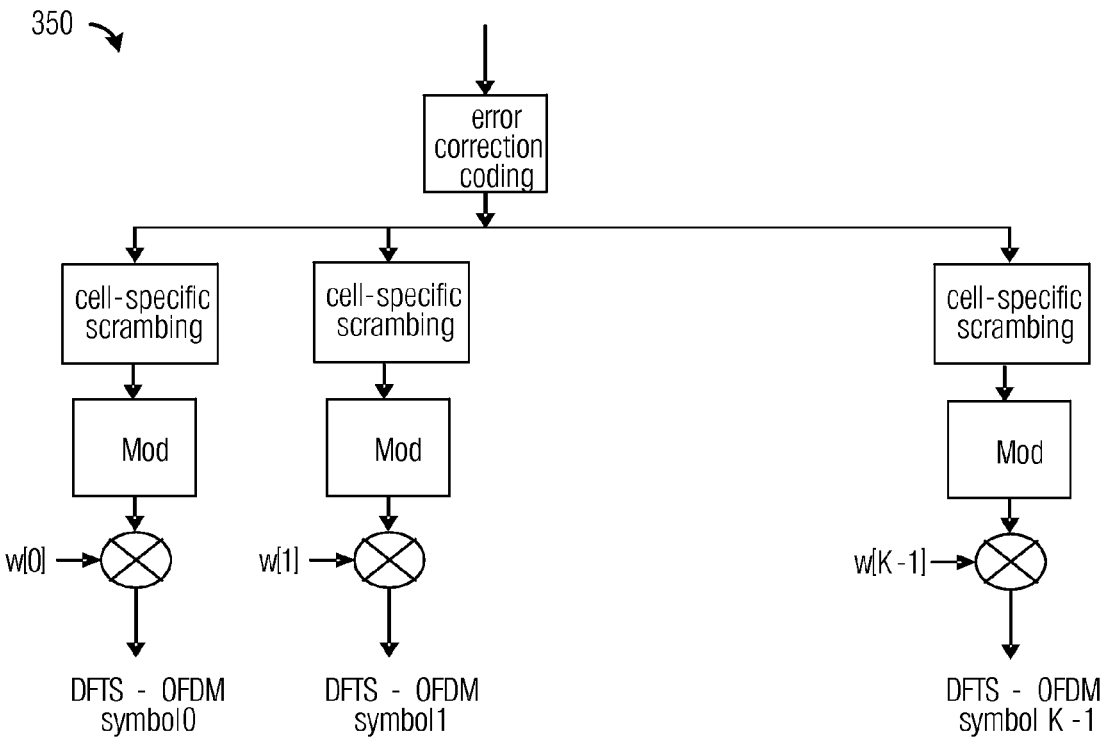
FIG. 3b is a diagram of a second technique for transmitting multiple ACK/NACK feedbacks.

FIG. 3b illustrates a technique 350 for transmitting multiple ACK/NACK feedbacks with DFT-S-OFDM. As shown in FIG. 3b, technique 350 employs a spreading factor $\{w[0], w[1], \ldots, w[K-1]\}$ to spread the ACK/NACK information bits. Technique 350 may be able to support 48 or more coded bits for transmission from UE to the eNB.

If there are multiple downlink CCs and/or multiple subframes for a UE's data transmission, the UE needs to feed back to the eNB the ACK/NACK information corresponding to the transport blocks on the multiple CCs and/or multiple subframes. The number of joint ACK/NACK states depends on the number of CCs and/or subframes, and the number of ACK/NACK feedbacks for each CC and/or subframes. The UE needs to map the ACK/NACK feedbacks (ACK/NACK states) of multiple CCs and/or subframes to ACK/NACK information bits (an ACK/NACK information vector), and then encode the ACK/NACK information vector by linear block coding, for example. Then the UE transmits the code word after modulation in uplink control channel.

Generally, the multiple ACK/NACK feedbacks are corresponding to multiple resource units, and the resource units may be CCs and/or subframes. For simplicity, CCs are used as an example of resource units; however, subframes may be used in place of CCs without loss of generality. After the linear block coding, rate matching may be used to match the resource allocation if needed, for example, by puncturing or repetition before modulation. As an example, a simple way to map ACK/NACK information to the ACK/NACK information vector is to use one bit for each ACK/NACK feedback. Therefore, there are total of 2*N information bits needed to transmit 2*N feedbacks, one feedback per transport block.

For example, $b_1 b_2$ are two bits, each bit value can be 0 or 1, to represent the ACK/NACK information, with $b_1$ associated with a first transport block, $b_2$ associated with a second transport block. Generally, $b_1 b_2 b_3 b_4 \ldots b_{2N-1} b_{2N}$, can represent the ACK/NACK feedbacks corresponding to 2*N transport blocks, with $b_{2i-1} b_{2i}$, associated with two transport blocks of an i-th CC (assuming 2 transport blocks per CC).

For example, an ACK can be mapped to a binary 1 while a NACK/DTX can be mapped to a binary 0 for a one transport block per CC scenario. For a case with dual transport blocks per CC, (ACK, NACK) can be mapped to a binary 10, and (ACK, ACK) can be mapped to a binary 11, (NACK, ACK) can be mapped to a binary 01, and (NACK, NACK)/DTX can be mapped to a binary 00. If DTX is implicitly fed back by NAK, in other words, the UE feeds back the NACK/DTX or (NACK, NACK)/DTX in case of dual transport blocks per CC by the same information bit representation, and then there will be fewer information bits.

If DTX needs to be explicitly fed back, more bits will be needed to represent the ACK/NACK feedbacks. For example, three bits for dual transport blocks per CC may be used to represent the five possible ACK/NACK/DTX states. Another DTX representation method may comprise DTX information being explicitly fed back for some CCs, while for other CCs, DTX information may be implicitly fed back.

Assuming the generator matrix of the linear block code is $[v(1), v(2), \ldots, v(n)]$, where $v(i)$, $i=1, 2, \ldots, n$ are the column vectors of the generator matrix, and the information bits are $b_1, b_2, \ldots, b_n$, then the code word will be $b_1 \cdot v(1) + b_2 \cdot v(2) + \ldots + b_n \cdot v(n)$, $b_1, b_2, \ldots, b_n \in \{0,1\}$, n is a positive integer. The information bits $b_1, b_2, \ldots, b_n$ correspond to the transport block with index 1, 2, ..., n.

Hence, when some of the CCs are not scheduled, the UE will not receive the PDCCH unless a false alarm occurs. Then the UE will transmit the DTX state ACK/NACK feedback information for those CCs; the ACK/NACK information bits corresponding to those CCs may be zeros, for example. Therefore, the generator vectors corresponding to those bits are not useful for encoding. At the eNB (the receiver of the ACK/NACK feedback from the UE), the eNB knows the scheduling information, hence the eNB knows which generator vectors are not useful in the encoding and these generator vectors will not be used for decoding in the eNB. Removing the generator vectors corresponding to the CCs not being scheduled produces an expurgated generator matrix.

A UE may have multiple DL CCs for data transmission depending on the radio resource control (RRC) configuration and the media access control (MAC) activation. The RRC layer configures a CC set. The MAC layer may activate or deactivate CC(s) to adapt to a UE's real traffic from the perspective of power savings, for example. The UE feeds back the ACK/NACK information bits for the CC set configured by RRC and/or MAC.

A scheduler in the eNB performs scheduling within the CC set according to the channel condition and other factors. For example, in a communications system supporting carrier aggregation, some of the CCs may be in lower frequency band which provides relatively larger coverage. The eNB (scheduler) may schedule some UEs only in the CCs in lower frequency band to gain better channel quality when other CCs in the higher frequency band experience poor channel quality. A special case may be to schedule a UE only on its DL primary CC which is linked to the UL CC on which its UL control signaling is transmitted.

When the eNB schedules a CC to transmit data packet(s) to a UE, the UE may fail to obtain the PDSCH because it misses the corresponding PDCCH. The UE generally cannot distinguish several situations: (a) there is no data packet scheduled for it in the subframe; or (b) there is data packet scheduled but it misses the corresponding PDCCH. The UE may respond with DTX in both situations. Therefore, it may be difficult to make a UE map the ACK/NACK feedbacks based on the scheduled CC set since it is difficult for a UE to know the scheduled CC set since the scheduled CC set may be dynamic in nature and continued signaling of the scheduled CC set may consume a significant amount of overhead. So the UE will map the ACK/NACK feedbacks based on the configured CC set, as configured by RRC and/or MAC.

Figure 4:
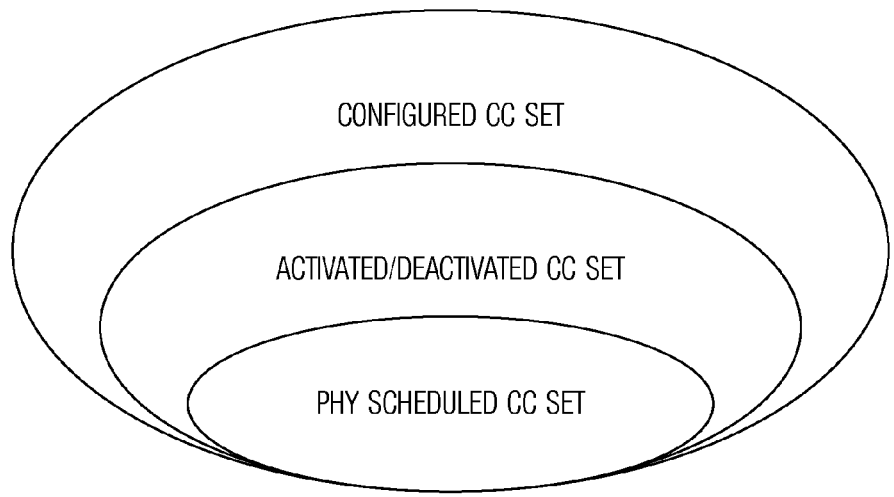
FIG. 4 is a diagram of a relative relationship of a configured CC set, an activated/deactivated CC set, and a scheduled CC set.

If N DL CCs are configured by MAC and/or RRC for a UE, the ACK/NACK feedbacks are mapped based on a configured CC set, but if only M CCs are scheduled in a time transmission interval, where M is an integer and M<N, it may not be efficient to transmit the ACK/NACK feedbacks using a ACK/NACK transmission scheme generally designed for N configured CCs. So a problem is how to efficiently transmit the possible ACK/NACK feedbacks to eNB if multiple DL CCs are activated and/or configured for a UE, but only a subset of the multiple activated and/or configured DL CCs is scheduled in a certain time transmission interval. FIG. 4 illustrates a relative relationship of a configured CC set, an activated/deactivated CC set, and a scheduled CC set.

Similarly, for TDD, there will multiple DL subframes but the ACK/NACK feedbacks should be fed back in only one single UL subframe, so there will be multiple ACK/NACK feedbacks for multiple DL suframes. Carrier aggregation is also supported in TDD, so there will be multiple subframes and/or component carriers to feedback ACK/NACK feedbacks. For simplicity, the ACK/NACK feedbacks for a CC in multiple subframes in a TDD system may be regarded as ACK/NACK feedbacks for multiple CCs in a subframe. The definition may be applicable for the following description for multiple component carriers.

Another issue is dynamically switching between one transport block and two transport blocks. One transport block or two transport blocks transmission is based on the channel environment or antenna correlation property at that time of scheduling, eNB thus has the possibility to dynamically change a number of transport blocks by changing the PDCCH. In case of single transport block transmission for some CCs, there will be less feedback for transmission. For example, when only one transport block is scheduled, only the first column vector is kept within the two column vectors corresponding to one CC. In other words, the coefficient of second vector will always be zero, when only one transport block is scheduled. Other choices may be to keep the second vector and set the coefficient of first vector to always zero. Alternatively, both of the two vectors may be used and to indicate ACK by all "1" coefficient, and NACK/DTX by all "0" coefficient, for example. Hence the similar transmission issues occur when using the common ACK/NACK mapping design for both one transport block per CC and two transport blocks per CC.

Figure 5:
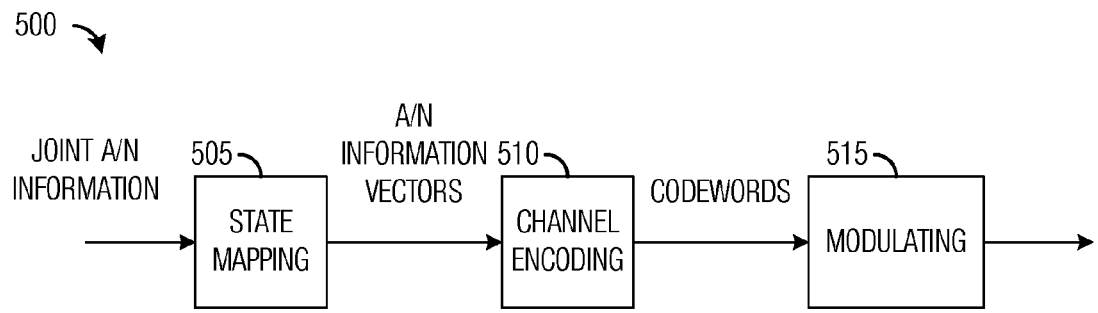
FIG. 5 is a diagram of information processing of ACK/ NACK information by a UE.

FIG. 5 illustrates information processing 500 of ACK/NACK information by a UE. Information processing 500 may be illustrative of processing of ACK/NACK information at a UE as the UE processes ACK/NACK information of transmissions made by an eNB to the UE for HARQ operation.

The UE may begin by performing a state mapping 505 of ACK/NACK feedbacks in the form of ACK/NACK states generated by the UE based on its error checking of transmissions from the eNB. Based on the error checking of transmissions, the UE may designate the ACK/NACK feedback of a transmission as being an ACK if the UE successfully error checked the transmission without error, a NACK if the UE unsuccessfully error checked the transmission with error, or a DTX if the UE did not detect a control channel indication related to the transmission. State mapping 505 may be performed by a state mapper and may take as input joint ACK/NACK information (e.g., the ACK/NACK states) and produce an ACK/NACK information vector(s).

State mapping 505 may follow mapping rules defined by the UE, the eNB, an operator of a communications system in which the UE operates, a technical specification, or so on. According to an embodiment, state mapping 505 may also make use of a configured CC set in the mapping of the ACK/NACK information into the ACK/NACK information vectors.

The UE may then perform a channel encoding 510 of the ACK/NACK information vector(s) to produce a code word(s). According to an embodiment, a linear block code may be used by a channel encoder to channel encode the ACK/NACK information vector(s). A detailed description of channel encoding 510 and the linear block code is provided below. The UE may then perform a modulating 515 on the code word(s) to prepare the code word(s) for transmission to the eNB.

However, for the case of a mapping method from ACK/NACK information state to ACK/NACK information bit with one bit per transport blocks, the minimum distance of the expurgated linear block code depends on which CCs are scheduled, and on which transport blocks are transmitted. The variety of minimum distance may involve a performance fluctuation in the conventional linear block codes. A code word mapping scheme to avoid or reduce the performance fluctuation, is provided below that obtains a relatively stable performance, regardless of which vectors are expurgated in the generator matrices of the linear block code when only a subset of CCs in a configured set of CCs or a single transport block per CC are scheduled.

In 3GPP TS 25.222, a (48, 10) linear block code is defined for the long TFCI bits with 8PSK by applying row puncturing of a sub-code of a (64, 10) second order Reed-Muller linear block code. The code words of the punctured (48, 10) sub-code of the second order Reed-Muller linear block codes are linear combination of 10 basis sequences. The basis sequences are shown in Table 1 below, where Table 1 is a reproduction of a table in the 3GPP TS 25.222 technical standards. In other words, the basis sequences are the column vectors of generator matrix. Another example is (20, 10) block code is defined in 3GPP TS 36.212 for uplink CQI transmission. Other linear block codes including first order Reed-Muller code as a sub-code may also be considered with the same method herein, such as (32, O) and (64, O) linear block codes, where O is an positive integer, or linear block codes after applying rate matching to the above said code.

In a situation with five CCs and two transport blocks per CC in a set of configured CCs, a (48, 10) linear block code is needed, and the 10 vectors of a generator matrix for the (48, 10) linear block code are expressible as v(i), i=1, ..., 10. If only two CCs are scheduled, for example, CC1 and CC2, then

TABLE 1

Basis sequences for (48, 10) TFCI code

| I | $M_{i,0}$ | $M_{i,1}$ | $M_{i,2}$ | $M_{i,3}$ | $M_{I,4}$ | $M_{i,5}$ | $M_{i,6}$ | $M_{I,7}$ | $M_{I,8}$ | $M_{i,9}$ |
|---|---|---|---|---|---|---|---|---|---|---|
| 0 | 1 | 0 | 0 | 0 | 0 | 0 | 1 | 0 | 1 | 0 |
| 1 | 0 | 1 | 0 | 0 | 0 | 0 | 1 | 1 | 0 | 0 |
| 2 | 1 | 1 | 0 | 0 | 0 | 0 | 1 | 1 | 0 | 1 |
| 3 | 1 | 0 | 1 | 0 | 0 | 0 | 1 | 1 | 1 | 0 |
| 4 | 0 | 1 | 1 | 0 | 0 | 0 | 1 | 0 | 1 | 0 |
| 5 | 1 | 1 | 1 | 0 | 0 | 0 | 1 | 1 | 1 | 0 |
| 6 | 1 | 0 | 0 | 1 | 0 | 0 | 1 | 1 | 1 | 1 |
| 7 | 0 | 1 | 0 | 1 | 0 | 0 | 1 | 1 | 0 | 1 |
| 8 | 1 | 1 | 0 | 1 | 0 | 0 | 1 | 0 | 1 | 0 |
| 9 | 0 | 0 | 1 | 1 | 0 | 0 | 1 | 1 | 0 | 0 |
| 10 | 0 | 1 | 1 | 1 | 0 | 0 | 1 | 1 | 0 | 1 |
| 11 | 1 | 1 | 1 | 1 | 0 | 0 | 1 | 1 | 1 | 1 |
| 12 | 1 | 0 | 0 | 0 | 1 | 0 | 1 | 0 | 1 | 1 |
| 13 | 0 | 1 | 0 | 0 | 1 | 0 | 1 | 1 | 1 | 0 |
| 14 | 1 | 1 | 0 | 0 | 1 | 0 | 1 | 0 | 0 | 1 |
| 15 | 1 | 0 | 1 | 0 | 1 | 0 | 1 | 0 | 1 | 1 |
| 16 | 0 | 1 | 1 | 0 | 1 | 0 | 1 | 1 | 0 | 0 |
| 17 | 1 | 1 | 1 | 0 | 1 | 0 | 1 | 1 | 1 | 0 |
| 18 | 0 | 0 | 0 | 1 | 1 | 0 | 1 | 0 | 0 | 1 |
| 19 | 1 | 0 | 0 | 1 | 1 | 0 | 1 | 0 | 1 | 1 |
| 20 | 0 | 1 | 0 | 1 | 1 | 0 | 1 | 0 | 1 | 0 |
| 21 | 0 | 0 | 1 | 1 | 1 | 0 | 1 | 0 | 1 | 0 |
| 22 | 1 | 0 | 1 | 1 | 1 | 0 | 1 | 1 | 0 | 1 |
| 23 | 0 | 1 | 1 | 1 | 1 | 0 | 1 | 1 | 1 | 0 |
| 24 | 0 | 0 | 0 | 0 | 0 | 1 | 1 | 1 | 0 | 1 |
| 25 | 1 | 0 | 0 | 0 | 0 | 1 | 1 | 1 | 1 | 0 |
| 26 | 1 | 1 | 0 | 0 | 0 | 1 | 1 | 1 | 1 | 1 |
| 27 | 0 | 0 | 1 | 0 | 0 | 1 | 1 | 0 | 1 | 1 |
| 28 | 1 | 0 | 1 | 0 | 0 | 1 | 1 | 1 | 0 | 1 |
| 29 | 1 | 1 | 1 | 0 | 0 | 1 | 1 | 0 | 1 | 1 |
| 30 | 0 | 0 | 0 | 1 | 0 | 1 | 1 | 0 | 0 | 1 |
| 31 | 0 | 1 | 0 | 1 | 0 | 1 | 1 | 0 | 0 | 1 |
| 32 | 1 | 1 | 0 | 1 | 0 | 1 | 1 | 1 | 1 | 1 |
| 33 | 1 | 0 | 1 | 1 | 0 | 1 | 1 | 0 | 0 | 1 |
| 34 | 0 | 1 | 1 | 1 | 0 | 1 | 1 | 1 | 1 | 0 |
| 35 | 1 | 1 | 1 | 1 | 0 | 1 | 1 | 1 | 0 | 1 |
| 36 | 0 | 0 | 0 | 0 | 1 | 1 | 1 | 1 | 1 | 0 |
| 37 | 1 | 0 | 0 | 0 | 1 | 1 | 1 | 0 | 1 | 1 |
| 38 | 1 | 1 | 0 | 0 | 1 | 1 | 1 | 1 | 1 | 1 |
| 39 | 0 | 0 | 1 | 0 | 1 | 1 | 1 | 1 | 0 | 0 |
| 40 | 1 | 0 | 1 | 0 | 1 | 1 | 1 | 1 | 0 | 0 |
| 41 | 1 | 1 | 1 | 0 | 1 | 1 | 1 | 1 | 1 | 1 |
| 42 | 0 | 0 | 0 | 1 | 1 | 1 | 1 | 1 | 1 | 1 |
| 43 | 0 | 1 | 0 | 1 | 1 | 1 | 1 | 0 | 1 | 0 |
| 44 | 1 | 1 | 0 | 1 | 1 | 1 | 1 | 0 | 1 | 0 |
| 45 | 0 | 0 | 1 | 1 | 1 | 1 | 1 | 0 | 1 | 1 |
| 46 | 0 | 1 | 1 | 1 | 1 | 1 | 1 | 0 | 0 | 1 |
| 47 | 1 | 1 | 1 | 1 | 1 | 1 | 1 | 1 | 0 | 0 |

Table 2 lists a weight distribution of G(48, A) linear block code from 3GPP TS 25.222.

TABLE 2

Weight distribution of G(48, A).

| A | 1 | 2 | 3 | 4 | 5 | 6 | 7 | 8 | 9 | 10 |
|---|---|---|---|---|---|---|---|---|---|---|
| $d_{min}(A)$ | 26 | 24 | 24 | 22 | 22 | 22 | 18 | 18 | 18 | 18 |
| Weight Enumerator (A) | 1 | 1 | 5 | 1 | 3 | 9 | 3 | 8 | 8 | 18 | the $b_5 b_6 b_7 b_8 b_9 b_{10}$ bits corresponding to carriers other than carriers CC1 and CC2 will be all zeros. The code word space may be expressible as $$b_1 \cdot v(1) + b_2 \cdot v(2) + b_3 \cdot v(3) + b_4 \cdot v(4),$$

in other words, only the vectors v(1), v(2), v(3), v(4) are used for code decoding at the eNB. Table 3 lists all the two CC scheduling combinations and their minimum distances of code word spaces when five CCs are configured. Table 4 lists all the cases of one CC scheduling.

TABLE 3

Minimum distance for two CCs when five CCs are configured.

| | Scheduled CC | | | | | | | | | |
|---|---|---|---|---|---|---|---|---|---|---|
| | (1, 2) | (1, 3) | (1, 4) | (1, 5) | (2, 3) | (2, 4) | (2, 5) | (3, 4) | (3, 5) | (4, 5) |
| Vector indices | 1, 2, 3, 4 | 1, 2, 5, 6 | 1, 2, 7, 8 | 1, 2, 9, 10 | 3, 4, 5, 6 | 3, 4, 7, 8 | 3, 4, 9, 10 | 5, 6, 7, 8 | 5, 6, 9, 10 | 7, 8, 9, 10 |
| $d_{min}$ | 22 | 22 | 20 | 19 | 24 | 20 | 20 | 20 | 19 | 19 |

TABLE 4

Minimum distance for one CC when five CCs are configured.

| | Scheduled CC | | | | |
|---|---|---|---|---|---|
| | 1 | 2 | 3 | 4 | 5 |
| Vector indices | 1, 2, | 3, 4 | 5, 6 | 7, 8 | 9, 10 |
| $d_{min}$ | 24 | 24 | 24 | 20 | 27 |

FIG. 6 illustrates a flow diagram of UE operations 600 in transmitting ACK/NACK information to an eNB. UE operations 600 may be indicative of operations occurring in a UE as the UE generates and transmits ACK/NACK information to an eNB in response to transmissions made to the UE by the eNB. The transmissions made to the UE may be over multiple CCs with one or more TBs per CC. UE operations 600 may occur while the UE is in a normal operation mode.

UE operations 600 may begin with the UE detecting its PDCCH (block 605). The UE may detect its PDCCH in order to determine if there are any transmissions scheduled for it over the associated CCs in the subframe. Furthermore, if there are transmissions scheduled for the UE, the UE may be able to determine locations of the transmissions, such as frequencies and/or times, using the information carried by the PDCCH.

If the UE failed to detect its PDCCH for a certain CC, where a PDCCH may or may not have been transmitted by the eNB, then the UE may not be able to detect its corresponding PDSCH and therefore be unable to receive the transmissions scheduled for it. The A/N feedback for the CC corresponding to the failed PDCCH detection is then DTX.

If there are data transmissions scheduled for the UE on a CC, the UE may (at specified frequencies and/or times) receive the transmissions, which are carried by PDSCH for 3GPP LTE, for example. After receiving the transmissions, the UE may decode the transmissions (block 610) then check the transmissions for errors, e.g., using a CRC. For each transmission, the UE may determine an ACK/NACK feedback based on results of the error check. For example, if the error check passed for a transmission, then the UE may set the ACK/NACK feedback to an ACK for the transmission. If the error check failed for a transmission, then the UE may set the ACK/NACK feedback to a NACK for the transmission. One or more A/N information may exist for a CC, since one or more transmissions may have been sent simultaneously over a CC.

Based on the joint ACK/NACK feedback for each of the transmissions over the configured CC set, the receiver may set bits of an ACK/NACK information vector(s) using mapping rule(s) (block 615). The setting of the bits of the ACK/NACK information vector(s) may be set based on state mapping rules.

According to an embodiment, failure to detect its PDCCH may be represented with an ACK/NACK feedback of DTX (or a NULL value) for the associated CC. The UE may then set bits in the ACK/NACK information vector(s) that correspond to CCs in a configured CC set with the DTX ACK/NACK feedback to a fixed value.

As an example, the bits corresponding to undetected CCs in the CC set may be set to a binary zero or some other prespecified or predefined value. For discussion purposes, if one bit in an ACK/NACK information vector corresponds to a CC in the configured CC set with the DTX state, then the one bit may be set to a fixed value (e.g., either a binary one or a binary zero). As discussed previously, the fixed value may be a prespecified or predefined value. If two bits in an ACK/NACK information vector corresponds to a CC in the configured CC set with the DTX state, then the two bits may be set to a fixed value (e.g., either a '00', '01', '10', or '11'). If three bits in an ACK/NACK information vector corresponds to a CC in the configured CC set with the DTX state, then the three bits may be set to a fixed value (e.g., either a '000', '001', '010', '011', '100', '101', '110', or '111').

Although the above examples illustrate situations wherein a single CC in the configured CC set is determined to be in the DTX state, the embodiments presented herein may be operable with any number of CCs in the configured CC set being determined to be in the DTX state as long as the number of CCs in the DTX state is smaller than a total number of CCs in the configured CC set. Therefore, the discussion of a single CC being determined to be in the DTX state should not be considered as being limiting to either the scope or the spirit of the embodiments.

Furthermore, the above examples illustrate situations wherein one, two, or three bits of an ACK/NACK information vector corresponds to a CC in the configured CC set with the DTX state. However, any number of bits may correspond to a CC. Therefore, the discussion of one, two, or three bits should not be construed as being limiting to either the scope or the spirit of the embodiments.

As an example, consider a situation wherein there are three CCs in a configured CC set and two TBs are transmitted on each CC. The ACK/NACK states for two TBs on a single CC may be {(ACK, ACK), (ACK, NACK), (NACK, ACK), (NACK, NACK), DTX}. There is a total of 124 joint ACK/NACK states for the three CCs, thereby requiring seven ACK/NACK information bits, $b_0b_1b_2b_3b_4b_5b_6$, to denote the 124 states, as shown in FIG. 7a. As shown in FIG. 7a, the seven ACK/NACK information bits may be set to any of the 124 values based on receiver's detection of transmissions occurring on the CCs in the configured CC set.

However, if the ACK/NACK state for one CC is DTX (e.g., CC #3), then the ACK/NACK feedbacks with at least the ACK/NACK state for CC #3 being DTX may be mapped to the combination of ACK/NACK information bits $b_0b_1b_2b_3b_4b_5b_6$ out of which at least one of the bits (e.g., $b_6$) is set to a fixed value c, as shown in FIG. 7b. As shown in FIG. 7b, bit $b_6$ is set to the fixed value c (as an example, the fixed value c may be equal to zero or one), while the remaining bits (bits $b_0$ through $b_5$) may be set to values dependent on the UE's ACK/NACK feedbacks for transmissions occurring on the remaining CCs in the configured CC set.

In other words, all ACK/NACK states where the ACK/NACK feedback corresponding to CC #3 is DTX, but ACK/NACK feedback for other CCs may be or may not be DTX, are mapped to the ACK/NACK information vector(s) whose bit $b_6$ (as an example) is fixed with value c (e.g., zero). The ACK/NACK feedbacks for CC #1 and CC #2 (which may be {(ACK, ACK), (ACK, NACK), (NACK, ACK), (NACK, NACK), DTX} for each CC) are represented by bits $b_0b_1b_2b_3b_4b_5$ (as an example). The first set of bits comprises $\{b_6\}$, the fixed value is $b_6=0$, and the second set comprises $\{b_0b_1b_2b_3b_4b_5\}$.

Although the illustrative examples shown in FIGS. 7a and 7b show that the last bit ($b_6$) is used to represent the DTX state of ACK/NACK feedback corresponding to CC #3, any bit position may be used to represent the DTX state of ACK/NACK feedback corresponding to CC #3. Furthermore, more than one bit may be used to represent the DTX state of ACK/NACK feedback corresponding to CC #3. The actual bit position(s) used to represent the DTX state of ACK/NACK feedback may be dependent on the mapping rules used to map the ACK/NACK states to the ACK/NACK information vector(s). Therefore, the discussion of the illustrative examples should not be construed as being limiting to either the scope or the spirit of the embodiments.

Returning back to FIG. 6, after state mapping, a generator matrix for use in encoding the ACK/NACK information vector(s) may be selected (block 630). According to an embodiment, the generator matrix may be selected based on the set of configured CCs. The generator matrix may be a generator matrix stored in the UE, as one of a plurality of generator matrices being prespecified, predefined, or otherwise preselected for a variety of sets of configured CCs. For example, the plurality of generator matrices may be specified in a technical specification, by an operator of a communications system, or so on.

Individual generator matrices may be selected to maximize the minimum distance of codewords in the code space of the linear block code specified by the selected generator matrix. The individual generator matrices may be formed from a base generator matrix of the linear block code using basic transformations, such as permutation of the vectors of the base generator matrix and combination of the vectors of the base generator matrix. Furthermore, the basic transformations applied to the base generator matrix may be applied repeatedly until a desired minimum distance property is achieved. A detailed discussion of the selection and generation of the generator matrices is provided below.

After selecting the generator matrix, the ACK/NACK information vector(s) may then be encoded based on a code generated by the selected generator matrix (block 635). Preferably, a linear block code, such as a Reed-Muller code, a punctured Reed-Muller code, or so on, may be used to encode the ACK/NACK information vector(s). After encoding the ACK/NACK information vector(s), the encoded ACK/NACK information vector(s) may then be modulated and transmitted back to the transmitter (block 640). Receiver operations 600 may then terminate.

The generator matrices in the plurality of generator matrices may be predefined and stored at both the UE and the eNB for subsequent use while the UE is encoding the ACK/NACK information vectors and the eNB is decoding the ACK/NACK information vectors. As discussed previously, the generator matrices may be formed by applying basic transformations, such as permutations and combinations of the vectors of a base generator matrix for a linear block code being used. The following presents exemplary generator matrices for a number of linear block codes and set of configured CCs.

In a configuration wherein there are three CCs in the set of configured CCs with two transport blocks per CC. The UE and the eNB may use a (48, 6) linear block code. In this configuration, if only two CCs are scheduled, from Table 3 above, the code words corresponding to CC1 and CC2, CC1 and CC3, CC2 and CC3 have minimum distance of 22, 22, and 24, respectively. Hence scheduling different two CCs means using the different code words with different minimum distances.

However, the code word space generated by vectors v(1), v(2), v(3), v(4), v(5), v(6) has the minimum distance of 22, and it is almost the best code word, especially when including a first order Reed-Muller as the sub-code enables the low complexity decoding with Inverse Fast Hadamard Transform (IFHT). It may be observed that the generator matrix of a linear block code is used to map the ACK/NACK information to code words. There are a number of equivalent generator matrices that may be used generate the same code word space, but the expurgated generator matrices from those equivalent generator matrices may have different minimum distance even if the vectors at the same positions are expurgated from the generator matrices due to scheduling.

According to an embodiment, new generator matrices may be constructed by permuting the order of vectors of the generator matrix in column basis, and adding (combining) one generator vector to another vector. These two operations of permutation and adding will generate an equivalent generator matrix. The two operations may be repeated multiple times until the generator matrix with the required minimum distance property is obtained. It is well known that invertible linear transforms are made of combinations of these two operations in Galois field GF(2). Hence, equivalently, an invertible linear transform may be used to generate a new generator matrix by applying this transform into an existing generator matrix.

To simplify the description, some symbols are defined to represent the generator matrix and the transformation from one generator matrix to another generator matrix. Numbers and square bracket may be used to represent the generator matrix made up of generator vectors. For example, [1, 2, 3, 4, 5, 6] denotes one generator matrix made of generator vectors v(1), v(2), v(3), v(4), v(5), v(6), in other words, the column vectors v(i) is denoted by an index of the column, e.g., i, and the order of numbers represent the order of column vectors.

An addition of two numbers to represent two vectors addition in binary Galois field GF(2) with the said columns numbers, for example, [1, 1+2, 3, 4, 5, 6] represents the generator matrix made of generator vectors [v(1), v(1)+v(2), v(3), v(4), v(5), v(6)]. Parenthesis (m, n) may be used to denote a family of generator matrices, for example, [(1, 2), 3, 4, 5, 6] denotes the generator matrix with generator matrix [v(1), v(2), v(3), v(4), v(5), v(6)] or [v(2), v(1), v(3), v(4), v(5), v(6)]. Hence the parenthesis denotes that the order of the vectors in the parenthesis can be any order.

Nesting parenthesis may be used to denote the multiple levels of freedom in terms of order. For example, [((1, 2), (3, 4)), 5, 6] denotes that v(1), v(2) may change order, v(3), v(4) may change order, furthermore [v(1). v(2)] and [v(3), v(4)] may change order, so [1, 2, 3, 4, 5, 6], [2, 1, 3, 4, 5, 6], [1, 2, 4, 3, 5, 6] and [3, 4, 1, 2, 5, 6], etc., are all workable. Parenthesis with one element such as (1) or (3+2) is used to separate the numbers from other numbers. The transformation from one generator matrix to another generator matrix can be represented by [1, 2, 3, 4, 5, 6, 7, 8, 9, 10]→[1+2, 3, 4, 5, 6, 7, 8, 9, 10], it means if the original generator matrix is [v(1), v(2), v(3), . . . , v(10)], then after transformation defined above the generator matrix is [v(1)+v(2), v(2), v(3), . . . , v(10)].

Suppose that an original code generator matrix is denoted as [1, 2, 3, 4, 5, 6], which are the first 6 vectors of the (48, 10) code defined in the 3GPP technical standards, then one equivalent generator matrix represented by the original column number is [((3, 6), (5, 4), (3+1, 3+2))], which has the property that code words generated by vectors [3, 6, 5, 4] has the minimum distance 24, and code words generated by the vectors [3, 6, (3+1), (3+2)] has the minimum distance 24, and also code words generated by the vectors [5, 4, (3+1), (3+2)] has the minimum distance 24. It can be easily verified that the constructed generator matrix above has the said minimum distance property. [((3, 6), (5, 4), (3+1, 3+2))] represents the versions in different order, such as [(5, 4), (3, 6), (3+1, 3+2)], [(5, 4), (3+1, 3+2), (3, 6)], etc. All of them have the said minimum distance property. Another equivalent generator matrix with the same minimum distance property is [((3, 6), (5, 4+3), (1+3+6, 2))]. [3, 6, 5, 4, 3+1, 3+2] is defined as the (48, 6) code 1, and [3, 6, 5, 4+3, 1+3+6, 2] is defined as the (48, 6) code 2 in the following.

Hence, the new generator matrix selected from the set of equivalent generator matrices has the property: for any two CCs scheduled, regardless of CC1 and CC2, or CC1 and CC3, or CC2 and CC3, the code word space generated by vectors [v(1), v(2), v(3), v(4)], or [v(1), v(2), v(5), v(6)], or [v(3), v(4), v(5), v(6)] respectively have the same maximal minimum distance, which is 24 for 48 length of linear block code. From coding theory, any (48, 4) binary linear block code has the upper bound of minimum distance 24, where 48 is the encoded bit block length, and 4 is the information bit block length. With the equivalent generator matrices, if only two CCs are scheduled, the code word used for UL ACK/NACK transmission will have the almost best minimum distance property, hence better decoding performance at the eNB.

If the notation discussed above is used to represent the operation between the original generator matrix and new generator matrix, then a first transform is to apply the "permutation" transformation [1, 2, 3, 4, 5, 6]→[3, 6, 5, 4, 1, 2] to original generator matrix, and then a second transform is to apply a "vectors addition" transformation [1, 2, 3, 4, 5, 6]→ [1, 2, 3, 4, 1+5, 1+6] to the result of the first transform. Additional permutations can be applied in the end to get a family of new equivalent generator matrices.

When three CCs are configured, with the generator matrix above has the minimum distance of 24 for any two CC combinations [1, 2, 3, 4], [1, 2, 5, 6], or [3, 4, 5, 6], then the generator matrix has the property that the minimum distance that is at least not less than 24 when only one CC is scheduled, or only one CC and one transport block are scheduled. Otherwise, supposing [1, 2] has the hamming distance of less than 24, the generator matrix [1, 2, 3, 4] would have the same minimum distance of less than 24 also, which contradicts with the fact that [1, 2, 3, 4] has the minimum distance 24. So with the generator matrix for three configured CCs, the expurgated linear codes will all have the good performance. The generator matrix is constructed by the linear combination of original vectors of the (48, 20) code, more precisely, the first six vectors. If the original vectors of the (48, 6) code can use IFHT to decode, then the new generator matrix defined by linear combination or the transforms discussed above, can also use the IFHT, with an exception that an additional inverse transform is required.

It may be possible to optimize a situation wherein one CC is scheduled when N CCs are configured. Suppose that a simple ACK/NACK state to information bit vector mapping by one bit per transport block is adopted. Furthermore, suppose one bit per transport block, $b_1 b_2 \ldots b_{2i-1} b_{2i} \ldots b_{2N-1} b_{2N}$ for a total of 2N bits, is used to represents the joint ACK/NACK information states, and [v(1), v(2), . . . , v(2N)] is the generator matrix of linear block code. Suppose that five CCs are configured with two transport blocks per component carrier, and then 10 vectors will be needed to map the joint ACK/NACK information states into code words.

The (48, 10) code's original generator matrix G is [1, 2, 3, 4, 5, 6, 7, 8, 9, 10], suppose that W2=[1, 2+6, 3, 6, 5, 4, 7, 8, 9, 10] is transformed generator matrix, after applying transform [1, 2, 3, 4, 5, 6, 7, 8, 9, 10]→[1, 2, 3+1+2, 4+2, 5+2, 6+1, 7+1+4+5, 8, 9, 10] to W2, generator matrix [1, 2+6, 3+1+2+6, 2, 5+2+6, 4+1, 7+1+6+5, 8, 9, 10] is produced, then [1, 2+6], [3+1+2+6, 2], [5+2+6, 4+1], [7+1+6+5, 8] have the minimum distance of 26, and [9, 10] has the minimum distance of 27. With the generator matrix, when only one CC is scheduled, the performance will be very good since the expurgated generator matrix has the minimum distance not less than 26. Generally, for a (n, k) linear block code with generator matrix $[v_1, v_2, \ldots, v_{2N}]$, a generator matrix with the property that $[v_{2i-1}, v_{2i}]$, $i \in \{1, 2, \ldots, N\}$ has the larger minimum distance than the upper bound of a (n, 4) linear block code. When n=32, 64, 48, or 20, the upper bound of the (n, 4) linear block code is n/2. However, when scheduling more than one CC, there may be worse performance with the generator matrix.

When N CC are configured, and some of CC are with single transport block transmission, the generator matrix will have n generator vectors, $n=2 \cdot n_2 + n_1$, where $n_2$ is the number of CCs with dual transport block transmission, $n_1$ is the number of CCs with single transport block transmission. The generator matrix $[v_1, v_2, \ldots, v_n]$ with the following property may be used, the property being that the code word space generated by generator vectors corresponding to CC i has larger minimum distances than the code word space generated by generator matrix $[v_1, v_2, \ldots, v_n]$.

The case of four or five CCs may be further considered. The (48, 6) linear block code 1 represented by original generator vectors is expressed as [5, 4, 3, 6, 3+1, 3+2], then G1=[3+1, 3+2, 3, 6, 5, 4, 7, 8, 9, 10]. If there are four configured CCs, the transform [1, 2, 3, 4, 5, 6, 7, 8]→[1, 2+3+4+5+6, 3+6, 4, 5+3+6, 3+4, 7+5+6, 8+3+4+6] may be applied to G1 to obtain the generator matrix for four configured CCs, which is expressible as G2=[3+1, 2+4+5+6, 3+4, 6, 5+3+4, 3+6, 7+5+4, 8+3+6+4].

Represent G2 by [1, 2, 3, 4, 5, 6, 7, 8], the minimum distance 22, 20, 20, and 20 for generator matrices [1, 2, 3, 4, 5, 6], [1, 2, 3, 4, 7, 8], [1, 2, 5, 6, 7, 8], and [3, 4, 5, 6, 7, 8], respectively. Therefore all have the minimum distance of not less than 20 while G2 has the minimum distance of 18. If any three CCs are scheduled, there will be a larger minimum distance and thus a performance gain. Generally, the generator matrix of the (48, 8) code may be chosen such that any expurgated generator matrix when only three CCs are scheduled has a larger minimum distance than the (48, 8) code, for example, not less than 20. Adopting the generator matrix, a stable performance when not all configured CCs are scheduled is afforded.

For (48, 10) code, at least there are four CCs of all CCs such that a corresponding (48, 8) code generator matrix has the property discussed above: any expurgated generator matrix when only three CCs are scheduled has a larger minimum distance than the (48, 8) code, for example, not less than 20.

In a situation when five CCs are configured, a generator matrix may be designed includes the generator matrix designed for four configured CCs. For example, for a (48, O) linear block code, the generator matrix G2=[3+1, 2+4+5+6, 3+4, 6, 5+3+4, 3+6, 7+5+4, 8+3+6+4] may be used as the generator matrix for four configured CCs, where the original generator matrix for the (48, O) linear block code as defined in the 3GPP TS 25.222 technical standards is denoted by [1, 2, 3, 4, 5, 6, 7, 8, 9, 10]. In other words, the generator matrix defined in the 3GPP TS 25.222 technical standards is [$v_1$, $v_2$, ..., $v_{10}$], and $$G2=[v_3+v_1, v_2+v_4+v_5+v_6, v_3+v_4, v_6, v_5+v_3+v_4, v_3+v_6, v_7+v_5+v_4, v_8+v_3+v_6+v_4],$$

and G2 may be denoted by $$[w_1, w_2, w_3, w_4, w_5, w_6, w_7, w_8],$$

then let $w_9 = v_1+v_3+v_4+v_6+v_7+v_8+v_9$, $w_{10}=v_1+v_2+v_3+v_4+v_5+v_6+v_{10}$, the generator matrix [$w_1$, $w_2$, $w_3$, $w_4$, $w_5$, $w_6$, $w_7$, $w_8$, $w_9$, $w_{10}$] has the property that the code word spaces generated by [$w_{2i-1}$, $w_{2i}$, $w_{2j-1}$, $w_{2j}$, $w_{2k-1}$, $w_{2k}$], i<j<k, i, j, k∈{1, 2, 3, 4, 5} have the minimum distances which are not less than 19. In other words, $$[w_{2i-1}, w_{2i}, w_{2j-1}, w_{2j}, w_{2k-1}, w_{2k}], i<j<k, i,j \in \{1,2,3,4\}, k=5$$

has the minimum distances which are not less than 19. It is known that $$[w_{2i-1}, w_{2i}, w_{2j-1}, w_{2j}, w_{2k-1}, w_{2k}], i<j<k, i,j,k \in \{1,2,3,4\}$$

has the minimum distances which are not less than 20. Generally, for five configured CCs, the generator matrices [$w_{2i-1}$, $w_{2i}$, $w_{2j-i}$, $w_{2j}$, $w_{2k-1}$, $w_{2k}$], i<j<k∈{1, 2, 3, 4, 5} have larger minimum distances than [$w_1$, $w_2$, $w_3$, $w_4$, $w_5$, $w_6$, $w_7$, $w_8$, $w_9$, $w_{10}$].

Another example of a linear block code is the (20, A) linear block code used in the 3GPP TS 36.212 technical standards. Table 5.2.3.3-1 (reproduced from the 3GPP TS 36.212 technical standards) lists the basis sequence for the (20, A) linear block code. The (20, A) linear block code may be obtained by applying row puncturing and row permutation to a (32, A) sub-code of a (32, 11) second order Reed-Muller code. Similar design of mapping from ACK/NACK to code words by design the new generator matrix may be achieved. Table 6 lists the minimum distance for the (20, A) linear block code, where $d_{min}(A)$ is the minimum distance of the code word generated the first A columns of original generator matrix of a (20, 10) linear block code.

TABLE 5.2.3.3-1

| | Basis sequences for (20, A) code. | | | | | | | | | | | | |
|---|---|---|---|---|---|---|---|---|---|---|---|---|---|
| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

TABLE 6

| Original (20, A) code minimum distance. | | | | | | | | | | |
|---|---|---|---|---|---|---|---|---|---|---|
| A | 1 | 2 | 3 | 4 | 5 | 6 | 7 | 8 | 9 | 10 |
| $d_{min}(A)$ | 20 | 10 | 8 | 8 | 8 | 8 | 6 | 6 | 6 | 6 |

Consider a situation where the eNB may only schedule part of CCs or transport blocks for DL transmission. If only one CC is scheduled with two transport blocks per CC, the two column vectors corresponding to the single CC will be used to generate the code word. The minimum distance of the generated code word space is shown in Table 7. Obviously, [3, 4]column vectors correspond to minimum distance 8, and [9, 10] also has the minimum distance 8 less than the minimum distance of 10 for the other pairs.

TABLE 7

| Minimum distance for one CC scheduled. | | | | |
|---|---|---|---|---|
| [1, 2] | [3, 4] | [5, 6] | [7, 8] | [9, 10] |
| 10 | 8 | 10 | 10 | 8 |

If 3 is replaced by 3+1, and 4 is replaced by 4+1, it is possible to obtain the minimum distance of 10. Similarly, [9, 10] can be replaced by [9+1, 10+1] to get the larger minimum distance. Generally speaking, adding other vectors to [9, 10] will not affect the minimum distance of other pairs such as [1, 2], and so forth. So there many degrees of freedom to make the code word spaces that correspond to the single CC with two transport blocks configuration has a larger minimum distance. Hence, in order to maintain better performance when only one CC is scheduled, chose any of the generator matrices such that the code words generated by two generator vectors $v_{2i-1}$, $v_{2i}$, i=1, 2, ..., N, where N is the number of configured CCs, has a minimum distance larger than 10, or just equal to 10. Generally speaking, for a (n, k) linear block code, the equivalent generator matrix may be chosen such that the code words generated by two generator vectors $v_{2i-1}$, $v_{2i}$, i=1, 2, ..., N, where N is the number of configured CCs, has the minimum distance larger than n/2, or just equal to n/2, and n is even.

The columns [4, 2, 5, 6] may be selected by searching based on a maximizing the minimum distance criteria. In fact, after searching all the columns combination, [4, 2, 5, 6], and [2, 4, 6, 10] are two set of vectors that have minimum distance of 10, which is the upper bound of minimum distance for the (20, 4) binary linear block code. And after further searching, [4, 2, 5, 6, 1, 3] can have the minimum distance of 8, which is also the upper bound of minimum distance for a (20, 6) binary linear block code. In the end, it is possible to add [7, 8, 9, 10] columns to have minimum distance of 6. Table 8 lists the minimum distance of [4, 2, 5, 6, 1, 3, 7, 8, 9, 10]. Then the expurgated code may be optimized for performance for only part of CCs that are scheduled, and/or only one transport block is indicated in a PDCCH by using columns permutation and adding column vector(s) to another vector. The operation may be repeated until a satisfactory generator matrix is obtained, which has a relatively larger minimum distance when block code is expurgated in case of not all configured CCs being scheduled or some CC(s) being switched to one transport block.

TABLE 8

| Minimum distance of [4, 2, 5, 6, 1, 3, 7, 8, 9, 10]. | | | | | | | | | | |
|---|---|---|---|---|---|---|---|---|---|---|
| A | 1 | 2 | 3 | 4 | 5 | 6 | 7 | 8 | 9 | 10 |
| $d_{min}(A)$ | 10 | 10 | 10 | 10 | 8 | 8 | 6 | 6 | 6 | 6 |

Consider a situation where three CCs are configured and the UE and eNB uses a (20, A) linear block code. Suppose that the original generator matrix columns [1, 2, 3, 4, 5, 6] are to be used for the (20, 6) code. After permutation, a new generator matrix represented by the original columns number for three configured CCs is expressible as [4, 2, 5, 6, 1, 3]. From the operation of adding one column vector to another column vector and repeating the operation many times results in the generator matrix that is just changed into another equivalent generator matrix with the same code word space. The operation of exchanging the position of any two column vectors and repeating the operation many times results in the generator matrix that is also just changed into another equivalent generator matrix with the same code word space as the one generated by the original generator matrix.

However, even if the generator matrix generates the same equivalent code word space, the expurgated codes are different. Just as depicted in the above, when only one CC is scheduled, the code word generated by v(9)+v(1) and v(10)+v(1) has better performance than the code word generated by v(9) and v(10) since the code word space generated by v(9)+v(1) and v(10)+v(1) has a larger minimum distance of 10, compared to a minimum distance of 8 for the code word generated by v(9) and v(10).

The construction procedure is as follows: For a generator matrix defined by [4, 2, 5, 6, 1, 3], apply the transform [1, 2, 3, 4, 5, 6]→[1+3, 2+3, 3, 4, 5+3, 6+3] to get [4+5, 2+5, 5, 6, 1+5, 3+5]. Here, the operation representation method is defined as: the transform [1, 2, 3, 4, 5, 6]→[1+3, 2+3, 3, 4, 5+3, 6+3] represents the vectors [$a_1$, $a_2$, ..., $a_6$] that are transformed into [$a_1+a_3$, $a_2+a_3$, $a_3$, $a_4$, $a_5+a_3$, $a_6+a_3$] (another transform can be [1, 2, 3, 4, 5, 6]→[1+3+4, 2, 3, 4, 5+4, 6+4]).

Further, the transformation [1, 2, 3, 4, 5, 6]→[1, 2, 3+1+2, 4+1+2, 5+1, 6] may be applied. [4+5, 2+5, 5, 6, 1+5, 3+5] is then transformed into [4+5, 2+5, 5+(4+5)+(2+5), 6+(4+5)+(2+5), (1+5)+(4+5), 3+5], which is just [4+5, 2+5, 5+4+2, 6+4+2, 1+4, 3+5]. The generator matrix for the (20, 6) code is listed as code 3.

The generator matrix defined by [((4+5, 2+5), (5+4+2, 6+4+2), (1+4, 3+5))], has the following property: when only 2 CCs are scheduled with 2 transport block per CC, the code word spaces generated by the corresponding expurgated generator matrix [1, 2, 3, 4], [1, 2, 5, 6], [3, 4, 5, 6] have the minimum distance of 10, where (a, b, c) represents the order among the set of {a, b, c} can be any order, ((a, b), (c, d), (e, f)) represents that the order among {(a, b), (c, d), (e, f)} can be any order, except the order within the set {a, b}, or {c, d} or {e, f} can be any order, and so on.

Generally, it may be required that (n, 6) linear block coding has the property that any generator matrices [1, 2, 3, 4], [1, 2, 5, 6], [3, 4, 5, 6] have the minimum distance x, where x is the upper bound of the minimum distance of a (n, 4) binary code. For example, for a (20, 4) linear block code, an upper bound is 10, for a (48, 4) linear block code, an upper bound is 24, for a (32, 4) linear block code, an upper bound is 16, and for a (15, 4) linear block code, an upper bound is 8, and so on. This form of generator matrix may be used to obtain the code words.

For any (n, 6) binary linear block code, a search method can be used also, wherein a search from the set of the equivalent generator matrices may be performed to find one having the best minimum distance among the equivalent generator matrices that derived from the original (n, 6) linear block code. The best minimum distance property can be defined as a function of three minimum distances corresponding to generator matrices [1, 2, 3, 4], [1, 2, 5, 6], and [3, 4, 5, 6].

In a case with two configured CCs, only four columns vectors are needed to encode the ACK/NACK information vector, assuming that two bits per CC for two transport blocks are used. Four column vectors of original (n, 10) generator matrix can be selected as the new generator matrix. If it is preferred to include an all "1" code word vector to have a slight better weight distribution for single transport block transmission of one CC, column 1 should be included. However, if code words with bigger hamming weight than 24 for dual transport block transmission of one CC is preferred, the all "1" code word vector shouldn't be included, since including the all "1" code word vector means that all other code words except for the all "1" code word will have a hamming weight of n/2 if the minimum distance is n/2, where n is even integer. For the case of two CCs being configured, it may also be possible to choose four vectors which have the best minimum distance property from the (n, 10) generator matrix, in the case of all "1" code word not being included. The code word generated by the four selected vectors has the maximum minimum distance and the enumeration of the code words whose hamming weight equal to the minimum distance is less than 15. If the generator matrix for three configured CCs has been define as [1, 2, 3, 4, 5, 6], then the generator matrix for two configured CCs can be [1, 2, 3, 4], [1, 2, 5, 6], or [3, 4, 5, 6].

When only one CC is scheduled but with two configured CCs, suppose that the original generator matrix is represented by [1, 2, 3, 4], [1, 2] is the generator matrix corresponding to CC1 and [3, 4] is the generator matrix corresponding to CC2, and then the performance with generator matrix [1, 2] and [3, 4] is not optimized conventionally. Even if the code word space for two configured CCs is not changed, it is possible to have a code word mapping method that has the better performance in case of only one CC is scheduled.

Selecting the first four vectors of the (48, 6) code 1 as an example, apply transform [1, 2, 3, 4]→[1+3, 2+3+4, 3, 4] to the generator matrix [1, 2, 3, 4], and then apply transform [1, 2, 3, 4]→[1, 2, 1+2+3, 2+4], the result is expressible as [1, 2, 3, 4]→[1+3, 2+3+4, 1+2+3+4, 2+3]. With the new generator matrix, the code words generated by vectors v(1), v(2) will have the larger minimum distance of 26 rather than 24, and the code words generated by vector v(3), v(4) also have the minimum distance of 26. Therefore, using a generator matrix with the property that at least one of expurgated linear block code has a bigger minimum distance, there will be a performance gain if only one CC is scheduled.

Consider a case with a (32, O) linear block code, where 32 is the length of encoded code words, and O is the length of information bits vectors. Table 5.2.2.6.4-1 shows the (32, O) linear block code from the 3GPP TS 36.212 technical standards for CQI in PUSCH.

TABLE 5.2.2.6.4-1

Basis sequences for (32, O) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0  | 1 | 1 | 0 | 0 | 0 | 0 | 0 | 0 | 0 | 0 | 1 |
| 1  | 1 | 1 | 1 | 0 | 0 | 0 | 0 | 0 | 0 | 1 | 1 |
| 2  | 1 | 0 | 0 | 1 | 0 | 0 | 1 | 0 | 1 | 1 | 1 |
| 3  | 1 | 0 | 1 | 1 | 0 | 0 | 0 | 0 | 1 | 0 | 1 |
| 4  | 1 | 1 | 1 | 1 | 0 | 0 | 0 | 1 | 0 | 0 | 1 |
| 5  | 1 | 1 | 0 | 0 | 1 | 0 | 1 | 1 | 1 | 0 | 1 |
| 6  | 1 | 0 | 1 | 0 | 1 | 0 | 1 | 0 | 1 | 1 | 1 |
| 7  | 1 | 0 | 0 | 1 | 1 | 0 | 0 | 1 | 1 | 0 | 1 |
| 8  | 1 | 1 | 0 | 1 | 1 | 0 | 0 | 1 | 0 | 1 | 1 |
| 9  | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 1 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 0 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

The column vectors of generator matrix may be represented by $v_1, v_2, \ldots, v_{10}, v_{11}$, where $v_i$, i=1, 2, ..., 11 is the $i^{th}$ column vectors in the table above. Then for ACK/NACK information vectors $b_1 b_2 \ldots b_{10} b_{11}$, $b_i \in \{0,1\}$, the code words after encoding are expressed as $b_1 \cdot v_1 + b_2 \cdot v_2 + \ldots + b_{10} \cdot v_{10} + b_{11} \cdot v_{11}$. The ACK/NACK information bits of CC i are $b_{2i-1}$, $b_{2i}$ for dual transport blocks. The ACK/NACK information bit of component i is $b_{2i-1}$ when only one transport block is scheduled, with i=1, 2, 3, ..., n, where n is the number of component carriers.

By simulation, the code word space generated by vectors $v_1, v_2, v_3, v_4$ has the minimum distance of 16. Note that 16 is the upper bound of minimum distance for (32, 4) code. Hence when only CC1 and CC2 are scheduled, the corresponding generator matrix $[v_1, v_2, v_3, v_4]$ generates the code word space with the best minimum distance property (reaching the upper bound of minimum distance). The upper bound of minimum distance for the (32, 4) linear block code is 16. Similarly, $[v_1, v_2, v_5, v_6]$ and $[v_3, v_4, v_5, v_6]$ also have the best minimum distance property that the corresponding code word space (the minimum distance of 16).

But for vectors $[v_1, v_2, v_7, v_8]$, $[v_3, v_4, v_7, v_8]$, and $[v_5, v_6, v_7, v_8]$, the minimum distances of the generated code word spaces are all 12, which is less than 16. Correspondingly, when CC1 and CC4 are scheduled, or CC2 and CC4 are scheduled, or CC3 and CC4 are scheduled, the expurgated linear block code may have a worse performance than in other cases, such as when CC1 and CC2 are scheduled.

Note that the first six vectors $v_i$, i=1, 2, 3, 4, 5, 6 are the generator vectors of the first order Reed-Muller code of length 32. Applying the transform [1, 2, 3, 4, 5, 6, 7, 8]→1+5, 2+4, 3+1+2+4, 2+6, 3+4+6, 1+5+6, 7, 8] to the original generator matrix $[v_1, v_2, \ldots, v_7, v_8]$, a new generator matrix $[v_1+v_5, v_2+v_4, v_3+v_1+v_2+v_4, v_2+v_6, v_3+v_4+v_6, v_1+v_5+v_6, v_7, v_8]$ is obtained, where the addition of vectors is the operation in the Galois field GF(2). The new generator matrix, denoted by $[w_1, w_2, \ldots, w_8]$, has the property that the code word space generated by $[w_{2i-1}, w_{2i}, w_{2j-1}, w_{2j}]$, i, j ∈ {1, 2, 3, 4}, i<j has the minimum distance of 16, which is larger than the minimum distance of the code word space generated by $[w_1, w_2, \ldots, w_8]$ (the minimum distance of the code word space generated by $[w_1, w_2, \ldots, w_8]$ is 12). In fact, when only two CC i, j are scheduled, the corresponding generator matrix has the minimum distance property that the code space generated by the generator matrix reaches the upper bound of the minimum distance, e.g., the upper bound is 16 for the (32, 4) linear block code.

Other examples of generator matrices include $[v_1+v_5+v_2+v_4, v_2+v_4, v_3+v_1+v_2+v_4, v_2+v_6, v_3+v_4+v_6, v_1+v_5+v_6, v_7, v_8]$, $[v_1+v_5, v_2+v_4, v_3+v_1+v_6+v_4, v_2+v_6, v_3+v_4+v_6, v_1+v_5+v_6, v_7, v_8]$, and so forth. They have the best minimum distance property when two CCs are scheduled.

Generally, a number of transforms are available to make the generator matrix have the said minimum distance property. The above examples are the result of just one search. Transforms to the generator matrix to obtain the new generator matrix having the same minimum distance property, for example, for (32, O) code, are also possible. The new generator matrix, denoted by $[w_1, w_2, \ldots, w_8]$, which has the property that the code word space generated by $[w_{2i-1}, w_{2i}, w_{2j-1}, w_{2j}]$, i, j$\in${1, 2, 3, 4}, i<j, for each i, j, has the larger minimum distance, then the generator matrices $[w_5, w_6, w_1, w_2, w_3, w_4, w_7, w_8]$ and $[w_5+w_6, w_6, w_2, w_3, w_4, w_7, w_8]$ will have the same property. Hence, generally, any generator matrix which has the said property for a linear block code may be used.

After channel coding, the code word vectors can fit the allocated resource for modulation by rate matching. For example, 32 bits can be turned into 48 bits by repeating 16 bits of the 32 bits. The rate matching will affect the minimum distance property slightly.

For vectors $[v_1, v_2, \ldots, v_8]$, after rate matching (repeating the first 16 bits of (32, O) code, for example), the generator matrix is expressible as $[\bar{v}_1, \bar{v}_2, \ldots, \bar{v}_8]$. The minimum distance for the code word space of generator matrix $[\bar{v}_3, \bar{v}_4, \ldots, \bar{v}_8]$ is 16 and its weight distribution is {16, 17, 17, 17, 17, 17, 17, 17, 18 . . . }, which is the worst case for scheduling 3 CCs. The minimum distance for $[\bar{v}_5, \bar{v}_6, \bar{v}_7, \bar{v}_8]$ is 17 and its weight distribution is {17, 17, 18, 18, 18, 19 . . . }, which is the worst case for scheduling 2 CCs. For the (32, O) linear block code defined by generator matrix $[w_1, w_2, \ldots, w_8]$, after rate matching, the generator matrix is denoted by $[\bar{w}_1, \bar{w}_2, \ldots, \bar{w}_8]$. The worst weight distribution cases for scheduling two or three CCs with previous generator matrix disappear with generator matrices generated as described herein.

In a case with five configured CCs, the generator matrix may include the generator matrix $[w_1, w_2, \ldots, w_8]$ defined for four CCs as a sub-matrix, for example, $[w_1, w_2, \ldots, w_8, v_9, v_{10}]$. After rate matching, the generator matrix is $[\bar{w}_1, \bar{w}_2, \ldots, \bar{w}_8, \bar{v}_9, \bar{v}_{10}]$. The minimum distance of the code word space with the previous generator matrix $[\bar{v}_3, \bar{v}_4, \ldots, \bar{v}_{10}]$ is 15. But the new generator matrices for four scheduled CC have the larger minimum distance of 15 or better weight distributions.

Another type of matrices can be obtained by being adaptive to the scheduling of three CCs for the (48, O) linear block code derived from the (32, O) linear block code by repetition. For example, when four CCs are configured, it is possible to request the better minimum distance when scheduling any three CCs.

Suppose the original generator vectors after rate matching are expressed as $v_1, v_2, \ldots, v_{10}$, which are generated by repeating the first 16 bits of the original (32, O) linear block code to generate the (48, O) linear block code. The length of the vectors is 48. Applying the transform [1, 2, 3, 4, 5, 6, 7, 8]→[1+5, 2+4, 1+2+3+4+5+6, 2+6, 5, 2+3+4, 2+4+6+7, 1+3+4+5+8], the new generator matrix is expressible as $$[v_1+v_5, v_2+v_4, v_1+v_2+v_3+v_4+v_5+v_6, v_2+v_6, v_5, v_2+v_3+v_4, v_2+v_4+v_6+v_7, v_1+v_3+v_4+v_5+v_8].$$

Denote the new generator matrix as $[w_1, w_2, \ldots, w_{10}]$, the property that the minimum distance of the code word space generated by $[w_1, w_2, w_3, w_4, w_5, w_6]$ is 20 is achieved. The minimum distance of the code word space generated by matrices $[w_1, w_2, w_3, w_4, w_7, w_8]$, $[w_1, w_2, w_5, w_6, w_7, w_8]$, or $[w_3, w_4, w_5, w_6, w_7, w_8]$ is 18. In other words, when three CC i, j, k are scheduled, i, j, k$\in${1, 2, 3, 4}, i<j<k, the corresponding code word spaces will have the minimum distance 18 or 20, which is larger than the minimum distance of the code word space generated by $[w_1, w_2, w_3, w_4, w_5, w_6, w_7, w_8]$, which is 16.

A transform P transforms generator matrix $[v_1, v_2, \ldots, v_7]$ into generator matrix $[w_1, w_2, \ldots, w_7]$, which is expressible as $$[v_1+v_5, v_2+v_4, v_1+v_2+v_3+v_4+v_5+v_6, v_2+v_6, v_5, v_2+v_3+v_4, v_2+v_4+v_6+v_7].$$

The transform P may be represented by a 7×7 invertible matrix since it is a combination of column vector permutations and column vector additions. Select vector expressible as $w_8=v_1+v_3+v_4+v_5+v_8$, then $[w_1, w_2, \ldots, w_8]$ is the generator matrix discussed above. Furthermore, $[w_1, w_2, \ldots, w_6]$ is transformed to $$[v_1+v_5, v_2+v_4, v_1+v_2+v_3+v_4+v_5+v_6, v_2+v_6, v_5, v_2+v_3+v_4]$$

by a 6×6 invertible matrix.

In a situation with five configured CCs, a generator matrix may include the generator matrix for four configured CCs as sub-matrix, for example, $$[v_1+v_5, v_2+v_4, v_1+v_2+v_3+v_4+v_5+v_6, v_2+v_6, v_5, v_2+v_3+v_4, v_2+v_4+v_6+v_7, v_1+v_3+v_4+v_5+v_8].$$

Suppose that $w_9=v_1+v_3+v_4+v_5+v_9$, $w_{10}=v_1+v_2+v_4+v_5+v_{10}$, then the code spaces generated by $[w_{2i-1}, w_{2i}, w_{2j-1}, w_{2j}, w_{2k-1}, w_{2k}, w_{2l-1}, w_{2l}]$, i<j<k<l, i, j, k, l$\in${1, 2, 3, 4, 5} have minimum distances which are larger than the minimum distance of $[w_1, w_2, \ldots, w_{10}]$. The minimum distance of $[w_1, w_2, \ldots, w_{10}]$ is 15. Hence when only four CCs are scheduled, the code word spaces will have a larger minimum distance, hence the multiple UL ACK/NACK transmission will have a better performance with the generator matrices presented herein.

Supposed that a first order (64, O) linear block code is as follows $v_i$, i=1, 2, 3, 4, 5, 6, 7 and $v_1^T$=[1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1 1]; where the superscript T represents the transpose of a matrix or vector.

$v_2^T$=[1 1 1 1 1 1 1 1 1 1 1 1 1 1 1 1 1 1 1 1 1 1 1 1 1 1 1 1 1 1 1 1 0 0 0 0 0 0 0 0 0 0 0 0 0 0 0 0 0 0 0 0 0 0 0 0 0 0 0 0 0 0 0 0];

$v_3^T$=[1 1 1 1 1 1 1 1 1 1 1 1 1 1 1 1 0 0 0 0 0 0 0 0 0 0 0 0 0 0 0 0 1 1 1 1 1 1 1 1 1 1 1 1 1 1 1 1 0 0 0 0 0 0 0 0 0 0 0 0 0 0 0 0];

$v_4^T$[1 1 1 1 1 1 1 1 0 0 0 0 0 0 0 0 1 1 1 1 1 1 1 1 0 0 0 0 0 0 0 0 1 1 1 1 1 1 1 1 0 0 0 0 0 0 0 0 1 1 1 1 1 1 1 1 0 0 0 0 0 0 0 0];

$v_5^T$=[1 1 1 1 0 0 0 0 1 1 1 1 0 0 0 0 1 1 1 1 0 0 0 0 1 1 1 1 0 0 0 0 1 1 1 1 0 0 0 0 1 1 1 1 0 0 0 0 1 1 1 1 0 0 0 0 1 1 1 1 0 0 0 0];

$v_6^T$=[1 1 0 0 1 1 0 0 1 1 0 0 1 1 0 0 1 1 0 0 1 1 0 0 1 1 0 0 1 1 0 0 1 1 0 0 1 1 0 0 1 1 0 0 1 1 0 0 1 1 0 0 1 1 0 0 1 1 0 0 1 1 0 0]; and $v_7^T$=[1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0 1 0];

It may be possible to chose $v_8$ as follows (for example) $v_8^T$=[0 0 0 0 1 1 1 1 1 1 1 1 0 0 0 0 1 1 1 1 0 0 0 0 1 1 1 1 0 0 0 0 1 1 1 1 1 1 0 0 0 0 0 0 0 0 0 0 0 0 0 0 0 0 0 0 0 0 0 0 0 0 0 0];

The transform [1, 2, 3, 4, 5, 6, 7, 8]→[1+6, 2, 3+6, 4, 5, 6, 7, 1+8] may be applied, thereby resulting in a new generator matrix=

$$[w_1, w_2, \ldots, w_8]=[v_1+v_6, v_2, v_3+v_6, v_4, v_5, v_6, v_7, v_1+v_8].$$

The new generator matrix has the property that the code word spaces generated by $[w_{2i-1}, w_{2i}, w_{2j-1}, w_{2j}]$, i, j$\in${1, 2, 3, 4}, i<j have the minimum distance of 32, which is the minimum distance upper bound for the (64, 4) linear block code. Therefore when scheduling CCs with indices i, j, the corresponding expurgated generator matrix $[w_{2i-1}, w_{2i}, w_{2j-1}, w_{2j}]$, i, j∈{1, 2, 3, 4}, i<j has the minimum distance of 32.

Puncturing rows 1 5 9 14 17 21 28 32 35 39 42 45 51 55 58 and 62, while keeping the rows 2 3 4 6 7 8 10 11 12 13 15 16 18 19 20 22 23 24 25 26 27 29 30 31 33 34 36 37 38 40 41 43 44 46 47 48 49 50 52 53 54 56 57 59 60 61 63 and 64 as what has been done in the 3GPP TS 25.222 technical standards for the (48, O) linear block code, another (48, O) linear block code is obtained by puncturing.

The transform [1, 2, 3, 4, 5, 6, 7, 8]→[1, 2, 3, 4, 5, 7, 6, 8] may be applied to $[v_1, v_2, \ldots, v_8]$ then the transform [1, 2, 3, 4, 5, 6, 7, 8]→[1+6+7, 2, 3+6+7, 4, 5, 6, 7, 1+8] may be applied, thereby producing a new generator matrix $$[v_1+v_6+v_7, v_2, v_3+v_6+v_7, v_4, v_5, v_7+v_8].$$

The new generator matrix, denoted by $[w_1, w_2, \ldots, w_8]$, has the property that the code word spaces generated by $[w_{2i-1}, w_{2i}, w_{2j-1}, w_{2j}]$, i, j∈{1, 2, 3, 4}, i<j have the minimum distance of 32, which is upper bound of minimum distance for (64, 4) linear block codes. Therefore when scheduling CCs with indices i, j, the corresponding expurgated generator matrix $$[w_{2i-1}, w_{2i}, w_{2j-1}, w_{2j}], i, j \in \{1,2,3,4\}, i<j$$

has the minimum distance of 32.

It may also be possible to select $v_8$ as (for example) $v_8^T$=[0 0 1 1 0 1 0 1 1 0 1 1 1 1 1 0 1 0 0 0 1 1 0 0 0 0 0 1 1 0 1 1 1 1 0 1 1 0 0 1 0 1 0 0 1 1 1 0 0 1 1 1 1 1 1 1 0 0 0 1 0 1]. Then the new generator matrix $$[v_1+v_3+v_4+v_6, v_2, v_2+v_3+v_5, v_1+v_3, v_5, v_6, v_7, v_8].$$

which may be denoted as $[w_1, w_2, \ldots, w_8]$, has the property that $$[w_{2i-1}, w_{2i}, w_{2j-1}, w_{2j}], i, j \in \{1,2,3,4\}, i<j, (i,j) \notin \{(3,4)\}$$

generates the code word space with the larger minimum distance than the code word space generated by $[w_1, w_2, \ldots, w_8]$. In fact, the minimum distance corresponding to $[w_{2i-1}, w_{2i}, w_{2j-1}, w_{2j}]$, i, j∈{1, 2, 3, 4}, i<j, (i, j)∉{(3,4)} is 32. Hence, the embodiments presented herein can chose the generator matrix with the transform P performed on a first order Reed-Muller code to ensure that when only two CCs are scheduled except primary CCs $i_0$ and $j_0$ are simultaneously scheduled, where $i_0, j_0$ are two indices of CCs, the code word space by expurgated generator matrix have the larger minimum distance.

In the above examples for linear block codes derived from a (64, A) Reed-Muller code by puncturing, the first seven vectors of the generator matrices may be linear combinations of the seven vectors of a (64, 7) first order Reed-Muller code. There is a transform P that transforms the seven vectors of the first order Reed-Muller code into the seven vectors of a generator matrix. The transform P may be invertible.

In the examples discussed above (e.g., the (48, O) linear block code by repeating a (32, O) Reed-Muller code, the (20, O) linear block code by puncturing a (32, O) Reed-Muller code, and the (32, O) linear block code), the first six vectors are a linear combination of vectors of the first order Reed-Muller code (or punctured/repeated first order Reed-Muller code), for example, the original first six vectors for the (48, O) and the (20, A) linear block codes, which ensures that IFHT may be used for decoding. The use of IFHT makes the codes desirable in hardware implementations.

The construction of a first order Reed-Muller code of length $2^m$ is well known. It includes a vector of length $2^m$ wherein each entry of the vector is 1, a vector of length $2^m$ with $2^{m-1}$ ones followed by $2^{m-1}$ zeros, a vector of length $2^m$ with $2^{m-2}$ ones followed by $2^{m-2}$ zeros followed by another $2^{m-2}$ ones and another $2^{m-2}$ zeros. Generally, an i-th vector comprises $2^{m-i}$ ones, followed by $2^{m-i}$ zeros, repeated until all $2^m$ values have been defined. Totally, there are m+1 generator vectors for a first order Reed-Muller code of length $2^m$ including the all "1" vector.

Generally, the linear block code for multiple ACK/NACK transmission may include the first order Reed-Muller code as sub-code (or punctured/repeated first order Reed-Muller code as sub-code). The generator vectors for the first order Reed-Muller code are beneficial to implementations using IFHT. However, the original generator vectors for the first order Reed-Muller code will not ensure the good minimum distance when only part of CCs are scheduled. Typically, when the generator matrix is $[v_1, v_2, v_3, v_4, v_5, v_6, v_7, v_8]$, suppose the minimum distance of the code word space generated by $[v_1, v_2, v_3, v_4, v_5, v_6, v_7, v_8]$ is $d_{min,8}$, the minimum distance of the code word space generated by $[v_{2i-1}, v_{2i}, v_{2j-1}, v_{2j}]$, i, j∈{1, 2, 3, 4}, i<j for some i, j may be equal to $d_{min,8}$.

The techniques discussed herein involve the application of a linear transform P to m vectors of first order Reed-Muller code to get the m vectors, where P is the m×m invertible matrix in GF(2), and the other 8-m vectors are chosen to make the generator matrix $[w_1, w_2, w_3, w_4, w_5, w_6, w_7, w_8]$, to have the property that the minimum distances of code word spaces generated by $[v_{2i-1}, v_{2i}, v_{2j-1}, v_{2j}]$, i, j∈{1, 2, 3, 4}, i<j are larger than the minimum distance of the code word space generated by the all eight vectors $[w_1, w_2, w_3, w_4, w_5, w_6, w_7, w_8]$, where m is less than or equal to the total number r of generator vectors of the first order Reed-Muller code, for example m=r−1 or r depending on whether all "1" vector is included or not as shown in the example discussed previously. The vectors of the generator matrices having said property can be found by searching. These matrices are predefined in the standard specification, the transmitter (e.g., eNB) and receiver (e.g., UE) can use these matrices for transmission and reception.

Usually, when the generator matrix is $[v_1, v_2, v_3, v_4, v_5, v_6, v_7, v_8]$, suppose that the minimum distance of the code word space generated by $[v_1, v_2, v_3, v_4, v_5, v_6, v_7, v_8]$ is $d_{min,8}$ the minimum distance of the code word space generated by $$[v_{2i-1}, v_{2i}, v_{2j-1}, v_{2j}, v_{2k-1}, v_{2k}], i, j, k \in \{1,2,3,4\}, i<j<k$$

for some i, j, k may be equal to $d_{min,8}$. The techniques discussed herein involve the application of a linear transform P to m vectors of first order Reed-Muller code to get the m vectors, where P is the m×m invertible matrix in GF(2), and chose the other 8-m vectors to make the generator matrix $[w_1, w_2, w_3, w_4, w_5, w_6, w_7, w_8]$, to have the property that the minimum distances of code word space generated by $[v_{2i-1}, v_{2i}, v_{2j-1}, v_{2j}, v_{2k-1}, v_{2k}]$, i, j, k∈{1, 2, 3, 4}, i<j<k are larger than the minimum distance of the code word space generated by the all eight vectors $[w_1, w_2, w_3, w_4, w_5, w_6, w_7, w_8]$.

Furthermore, the generator matrix for four or five configured CCs may be chosen such that they both include the generator matrix designed for three configured CCs. With these generator matrices, the implementation in the UE and eNB will be simplified. The generator matrix for five configured CCs may also be chosen such that it includes the generator matrix designed for four configured CCs.

For example, for code 1 of the (48, 6) linear block code, the new code can be represented by [v(1), v(2), v(3), v(4), v(5), v(6)]·P, expressible as $$P = \begin{bmatrix} 0 & 0 & 0 & 0 & 1 & 0 \\ 0 & 0 & 0 & 0 & 0 & 1 \\ 1 & 0 & 0 & 0 & 0 & 0 \\ 0 & 0 & 0 & 1 & 0 & 0 \\ 0 & 0 & 1 & 0 & 0 & 0 \\ 0 & 1 & 0 & 0 & 0 & 0 \end{bmatrix} \cdot \begin{bmatrix} 1 & 0 & 0 & 0 & 1 & 1 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix}.$$

Generally, P is a defined transformation matrix in the system, therefore, in the decoder, the received signal will be $[v(1), v(2), v(3), v(4), v(5), v(6)] \cdot P \cdot (b_1, b_2, b_3, b_4, b_5, b_6)^T$ after conventional inverse FHT, $P \cdot (b_1, b_2, b_3, b_4, b_5, b_6)^T$ is obtained. Then, the inverse of P is applied, resulting in the bit information $b_i$, i=1, 2, . . . , 6. Notice that the all '1' vector is not included in the (48, 6) linear block code proposed herein, therefore there is a total of seven vectors in the first order Reed-Muller code of length 64 (hence of length 48), and there is a total of six vectors in the first order Reed-Muller code of length 32 (hence of length 20). Generally, there are m vectors $v_1, v_2, \ldots, v_m$ in first order Reed-Muller code, the linear transform P is a m×m matrix predefined in the system. Suppose the number of total generator vectors is n, the generator vectors are $v_1, v_2, \ldots, v_n$, where the order of $v_1, v_2, \ldots, v_n$ may be permuted to construct the generator matrix, then there is the normal decoding with IFHT to get the information for bits $P \cdot (b_1, b_2, \ldots, b_m)^T$ and $b_{m+1}, \ldots, b_n$, applying the inverse transform of P results in the information for bits $b_1, b_2, \ldots, b_n$ Generally, suppose that an original generator matrix $[v_1, v_2, \ldots, v_n]$ for a (n, k) linear block code is available, an invertible transform P from $[v_1, v_2, \ldots, v_n]$ to $[w_1, w_2, \ldots, w_n]$ may be defined, where $v_i$, i=1, 2, . . . , n include the vectors of first order Reed-Muller code $p_1, p_2, \ldots, p_m$ where m is the number of first order Reed-Muller code words with length n, or include the transformed vectors of first order Reed-Muller code, by the transform $v_i \rightarrow v_i + v_1, v_1 \rightarrow v_1$, i=2, 3, . . . , m where $v_1$ is the all "1" vector. The transform P ensures that the generator matrix $[w_1, w_2, \ldots, w_n]$ has the said minimum distance property discussed previously in some examples. In other words, the transform P may not just be m×m matrix for first order Reed-Muller code, but generally the transform from $[v_1, v_2, \ldots, v_n]$ to $[w_1, w_2, \ldots, w_n]$. In other words, for the same code word space, there are a lot of generator matrices that can generate the same code word space. For any two of these generator matrices, there is an invertible n×n matrix P that transforms one of generator matrices to the other. Especially, if there is an m×m invertible matrix to transform part of the vectors in one generator matrix to part of the vectors in another matrix, but keep the other vectors not being changed, the implementation complexity may be reduced.

In a situation when p CCs are scheduled, it may not be possible for all of the corresponding expurgated generator matrices to have the larger minimum distance to meet the upper bound of the minimum distance. However, it may be possible to obtain a generator matrix such that at most one expurgated generator matrix doesn't meet the upper bound on the minimum distance property.

It is known that an IFHT can be used to decode a first order Reed-Muller code. So keeping the first order Reed-Muller code (or shorted/punctured/repeated version thereof) as a sub-code of linear block code is very desirable. Generally, the techniques presented herein involves the use of a transform matrix p which transforms the column vectors of the first order Reed-Muller code into new column vectors, and chose other vectors to form a (n, k) linear block code, such that the expurgated generator matrix with 2·p vectors corresponding to the p scheduled CCs have the larger minimum distances than the code word space of the said (n, k) code words, where 2p<k.

For example, consider a situation where k=8, p=2, n=32, the larger minimum distance is 16. While, when k=6, p=2, n=48, the larger minimum distance is 24, and when k=6, p=1, the larger minimum distance is 26. Furthermore, when k=8, p=3, n=48, the larger minimum distances are not less than 20, and if k=6, p=2, n=20, the larger minimum distance is 10. In situations when k=8, p=3, n=48, the larger minimum distance is 18, k=10, p=4, n=48, the larger distance is 16, k=10, p=3, n=48, the larger distance is 19. The remaining vectors (those that are not a linear combination of vectors of the first order Reed-Muller code) can be chose freely only if the final generator matrix has the said minimum distance property.

In the prior art, the transform P may be an identity transform or a column permutation transform. These transforms are trivial transforms. Another example of a trivial case is that used in the (32, O) linear block code or the (48, O) linear block code as specified in the 3GPP technical specifications, which will be described below. Generally, suppose the generator vectors of a first order Reed-Muller code (or a punctured/repeated first order Reed-Muller code) are $[v_1, v_2, \ldots, v_l]$, suppose that $v_1$ is the vector where all elements are "1". Another trivial transform is expressible as $[v_1, v_2, \ldots, v_l] \rightarrow [v_1, v_1+v_2, \ldots, v_1+v_l]$, which affects the decoding with IFHT by multiplying a constant −1, it may be referred to as a multiplying −1 transform. These trivial transforms and their combination may not be efficient in the construction of the generator matrix having the minimum distance property needed herein. The transform P discussed herein includes a combination of transforms other than the trivial transforms presented above. In other words, P may be the combination of said trivial transforms and other non-trivial transforms.

Generally, a method of transmitting multiple ACK/NACK information has been described. The method includes ACK/NACK information states that may first be mapped into ACK/NACK information bits, and then a linear block code may be used to map the information bits into code words to be transmitted in the UL control channel. When some of the CCs are DTX or only single transport block is scheduled in some CCs, then there are some ACK/NACK information bits that are set to fixed values. The method is characterized by a mapping from the ACK/NACK information states to code words that satisfy the property that the mapping uses generator matrices having the properties discussed previously, such as maximum minimum distance properties. For example: a linear block code used for channel coding has a generator matrix selected from the set of equivalent generator matrices such that for a (n, 6) generator matrix, the expurgated generator matrices $$[v(1), v(2), v(3), v(4)], [v(3), v(4), v(5), v(6)], [v(1), v(2), v(5), v(6)]$$

have the maximum minimum distance of n/2 when n is 48, 20, 32, 64, etc.

According to an embodiment, the linear block code (n, k), k>6 may include the (n, 6) linear block code as sub-code. Furthermore, the generator matrix for (n, k) linear block code may include the generator matrix of (n, k') linear code, where k' is an integer value smaller than k, for example, if k=10, k' may be equal to 9, 8, 7, 6, 5, 4, and so on, with 8 being preferred. Also the (n, 8) linear block code will have the property that any (n, 6) sub-code corresponding to any three CCs that are scheduled has a larger minimum distance than the (n, 8) linear block code. When n=48, the larger minimum distance is not less than 20.

Additionally, the (n, 8) linear block code will have the property that any (n, 4) sub-code corresponding to any two CCs that are scheduled has the larger minimum distance than the (n, 8) linear block code. When n=32, the larger minimum distance is 16; when n=64, the larger minimum distance is 32; and when n=48, the larger minimum distance is not less than 22.

According to an embodiment, for a (n, k) linear block code, where k>8, the (n, k) linear block code includes the (n, 8) linear block code as a sub-code. For example, for (n, k) linear block codes with k=10, and n=64, 48, 32, 20, and so on.

According to an embodiment, the linear block code at least includes the first order Reed-Muller code as a sub-code except the all "1" vector. For example, for a (48, 6) linear block code, only the all "1" vector is not included, however, for the (20, 6) linear block code, the all "1" vector is included. Generator matrices for the (48, 6) linear block code and the (20, 6) linear block code are as described previously.

In LTE and LTE-A compliant systems, there maybe is up to two transport blocks in a component carrier and eNB can dynamically switch the scheduling between one transport block and two transport blocks. For example, in transmission mode 4 for closed-loop MIMO operation, Downlink Control Information (DCI) format 2 and DCI format 1A are both supported. DCI format 2 can be used to support one or two transport blocks transmission, while DCI format 1A is only used to support one transport block transmission. An eNB can dynamically switch between one transport block transmission and two transport blocks transmission by transmitting PDCCH carrying different DCI. For example, PDCCH can carry DCI of format 2 to support only one transport block by disabling one transport block in DCI signaling. Or PDCCH can carry DCI of format 1A to support only one transport block. PDCCH can support 2 blocks with DCI of format 2 when both transport blocks are enabled.

Suppose one transport block per CC is scheduled, then a (20, 3) linear block code, as presented below, may be derived from a (20, 6) linear block code, for example, by only keeping the first column vector within the two column vectors corresponding to one CC. In other words, the coefficient of second vector will always be zero, when only one transport block is scheduled. Other choices may be to keep the second vector and set the coefficient of first vector to always zero. Alternatively, both of the two vectors may be used and to indicate ACK by all "1" coefficient, and NACK/DTX by all "0" coefficient. Hence generally, there may be three kinds of mapping methods for ACK/NACK information from one transport block to two transport blocks.

1) ACK→(ACK, NACK), NACK→(NACK, NACK);
2) ACK→(NACK, ACK), NACK→(NACK, NACK); and
3) ACK→(ACK, ACK), NACK→(NACK, NACK).

When there is no transmitted PDSCH detected and there is no transmitted PDCCH detected, the UE needs to feed back the unique DTX regardless of single transport block or dual transport blocks transmission because the UE can't know from the missed control channel (if any) whether there is single transport block transmission or dual transport block transmission. For example, DTX can be mapped into (NACK, NACK) regardless of single transport block transmission or dual transport block transmission.

Within the code word space generated by generator matrix [2i−1, 2i], all the equivalent generator matrices are [(2i−1, 2i)], [((2i−1)+2i, 2i)], [(2i−1, (2i)+(2i−1))], which are, just [v(2i−1), v(2i)], [v(2i−1)+v(2i), v(2i)], [v(2i−1), v(2i)+v(2i−1)] and all the permuted versions in order within the generator matrix $[v(2i-1), v(2i)]$ or $[v(2i), v(2i-1)]$, $[v(2i-1)+v(2i), v(2i)]$ or $[v(2i), v(2i-1)+v(2i)]$, $[v(2i-1), v(2i)+v(2i-1)]$ or $[v(2i)+v(2i-1), v(2i-1)]$.

For the case of three configured CCs, select the one of the three generator vectors for each CC such that when all the CCs are scheduled with a single transport block, the expurgated generator matrix [1, 3, 5] has the largest minimum distance when using single transport block mapping method one, or [2, 4, 6] has the largest minimum distance when using single transport block mapping method two, or [1+2, 3+4, 5+6] has the largest minimum distance when using single transport block mapping method three. Hence there are three possibilities for the non-zero code word space of single transport block transmission of each CC, which are v(2i−1), v(2i), or v(2i)+v(2i−1). For three configured CCs, there will be a total of 3*3*3 choices, select those choices that have the largest minimum distance corresponding to generator matrix [1, 3, 5] or [2, 4, 6] or [1+2, 3+4, 5+6]. Further, chose the one with least enumeration of minimum distance within the choices that meet the largest minimum distance. In other words, if two choices have the same minimum distance, chose the one with minimal number of vectors whose hamming weight equal to the minimum distance. Generally, the transform within the code word space generated by the two vectors corresponding to one CC will give a family of generator matrices. It is possible to choose one from the family of (n, 6) linear block codes.

Generally, for N configured CCs, where N is an positive integer, it is possible to select one from the 6 generator matrices for each component carrier i, $[v(2i-1), v(2i)]$ or $[v(2i), v(2i-1)]$, $[v(2i-1)+v(2i), v(2i)]$ or $[v(2i), v(2i-1)+v(2i)]$, $[v(2i-1), v(2i)+v(2i-1)]$ or $[v(2i)+v(2i-1), v(2i-1)]$ to have a new generator matrix $[w_1, w_2, \ldots, w_{2N}]$, such that the minimum distance of the code word space generated by $[w_1, w_3, w_5, \ldots, w_{2N-1}]$ is largest among all the different pair selections in the case that the vectors $w_{2i-1}$, i=1, 2, ..., N are used for channel coding when single transport block transmission is scheduled, or such that the minimum distance of the code word space generated by $[w_2, w_4, \ldots, w_{2N}]$ is largest among all the different pair selections in the case that $w_{2i}$, i=1, 2, ..., N are used for channel coding when single transport block transmission is scheduled, or such that the minimum distance of the code word space generated by $[w_1+w_2, w_3+w_4, \ldots, w_{2N-1}+w_{2N}]$ is largest among all the different pair selections in the case that $w_{2i-1}+w_{2i}$, i=1, 2, ..., N are used for channel coding when single transport block transmission is scheduled (that is when single transport block mapping method 3 is used). The generator matrix $[w_1, w_2, \ldots, w_{2N}]$ is a generator matrix is as described previously and is used for transmission and reception, and respectively the mapping method 1, 2 or 3 is used for mapping between ACK/NACK information of single transport block and ACK/NACK information of dual transport blocks.

Generally, in another method for a situation with N configured CCs, suppose that the generator matrix is $[v_1, v_2, \ldots, v_{2N-1}, v_{2N}]$ where $v_i = v(i)$, N is a positive integer, then select one from the 6 generator matrices $[v(2i-1), v(2i)]$ or $[v(2i), v(2i-1)]$, $[v(2i-1)+v(2i), v(2i)]$ or $[v(2i), v(2i-1)+v(2i)]$, $[v(2i-1), v(2i-1)+v(2i)]$ or $[v(2i-1)+v(2i), v(2i-1)]$ for each i∈{1, 2, . . . , N} to build a generator matrix [$w_1$, $w_2$, . . . , $w_{2N}$], such that the minimum distance of the code word space generated by [$w_1$, $w_2$, . . . , $w_{2i-2}$, $x_i$, $w_{2i+1}$, $w_{2i+2}$, . . . , $w_{2N}$, $w_{2N-1}$] is largest or the enumeration of the vectors whose weights are equal to the minimum distance is least among all the different pair selections in the case that the vectors $x_i$, i=1, 2, . . . , N are used for channel coding when single transport block transmission is scheduled. $x_i = w_{2i-1}$, i=1, 2, . . . , N, or $x_i = w_{2i}$, i=1, 2, . . . , N, or $x_i = w_{2i-1} + w_{2i}$, i=1, 2, . . . , N respectively when single transport block ACK/NACK information to dual transport block ACK/NACK information mapping method 1, 2, or 3 is used. The generator matrix [$w_1$, $w_2$, . . . , $w_{2N}$] is as described previously and is used for transmission and reception. Vector $x_i$ has three possible vector values v(2i−1), v(2i), or v(2i)+v(2i−1) for each mapping method.

Equivalently, suppose that the generator matrix is [$v_1$, $v_2$, . . . , $v_{2N-1}$, $v_{2N}$] where $v_i = v(i)$, N is a positive integer, then select one from the 6 generator matrices $$[v(2i-1), v(2i)] \text{ or } [v(2i), v(2i-1)],$$

$$[v(2i-1)+v(2i), v(2i)] \text{ or } [v(2i), v(2i-1)+v(2i)],$$

$$[v(2i-1), v(2i-1)+v(2i)] \text{ or } [v(2i-1)+v(2i), v(2i-1)]$$

for each i∈{1, 2, . . . , N} to build a generator matrix [$w_1$, $w_2$, . . . , $w_{2N}$], such that [$v_1$, $v_2$, . . . , $v_{2i-2}$, $x_i$, $v_{2i+i}$, $v_{2i+2}$, . . . , $v_{2N}$, $v_{2N-1}$] is largest or the enumeration of the vectors whose weights are equal to the minimum distance is least among all the different pair selections since the code word space generated by [$v_1$, $v_2$, $v_{2i-2}$, $v_{2i+1}$, $v_{4i+2}$, . . . , $v_{2N}$, $v_{2N-1}$] is same as the code word space generated by [$w_1$, $w_2$, . . . , $w_{2i-2}$, $w_{2i+1}$, $w_{2i+2}$, . . . , $w_{2N}$, $w_{2N-1}$].

As an example, suppose that the original generator matrix [$v_1$, . . . , $v_{10}$] is the generator matrix for a (48, O) linear block code as defined in the 3GPP TS 25.222 technical standards, it may be possible to select [$v_2$, $v_1$] as [$w_1$, $w_2$], and [$v_7 + v_8$, $v_8$] as [$w_7$, $w_8$]. The enumeration of the vectors whose weights are equal to the minimum distance of 18 is least among three different pair selections for the code word space corresponding to [$w_1$, $w_3$, $w_4$, . . . , $w_{10}$] and [$w_1$, $w_2$, . . . , $w_7$, $w_9$, $w_{10}$], respectively. For example, suppose the generator matrix is the (48, O) generator matrix is derived by repetition from the (32, O) linear block code in the 3GPP TS 36.212 technical standards, then [$v_5 + v_6$, $v_6$] may be selected as [$w_5$, $w_6$] to make [$v_1$, $v_2$, $v_3$, $v_4$, $w_5$, $v_7$, $v_8$, $v_9$, $v_{10}$] have larger minimum distance of 16 rather than 15.

Another example is the dual Reed-Muller code used in LTE-A TDD system, For example, $b_1 b_2$ are two bits, each bit value can be 0 or 1, to represent the ACK/NACK information, with $b_1$ associated with a first transport block, $b_2$ associated with a second transport block. Generally, $b_1 b_2 b_3 b_4 \ldots b_{2N-1} b_{2N}$ can represent the ACK/NACK feedbacks corresponding to 2*N transport blocks, with $b_{2i-1} b_2$ associated with two transport blocks of an i-th CC (assuming 2 transport blocks per CC). The even indexed bits $b_2 b_4 \ldots b_{2N}$ are encode by a first (24, A) Reed-Muller code, and the odd indexed bits are encoded by a second (24, A) Reed-Muller code. Both the matrices of the first Reed-Muller code and the second Reed-Muller code are first 24 rows of generator matrix of (32, A) Reed-Muller code. After encoding, 48 bits are modulated and transmitted in PUCCH channel.

Hence a generator matrix of (48, 2A) has been constructed to have the following form $$\begin{pmatrix} G_1 & \\ & G_2 \end{pmatrix}$$

for the dual Reed-Muller code scheme, where $G_1 = G_2$ is the generator matrix of (24, A) Reed-Muller code. The mapping from {ACK, NACK} to {(ACK, ACK), (ACK, NACK), (NACK, ACK), (NACK, NACK)}: ACK→(ACK, ACK), NACK→(NACK, NACK) may be used, then a derived code word space has a largest minimum distance when single transport block is transmitted on a component carrier. The derived generator matrix is $$\begin{pmatrix} G_1 \\ G_2 \end{pmatrix}.$$

Figure 8:
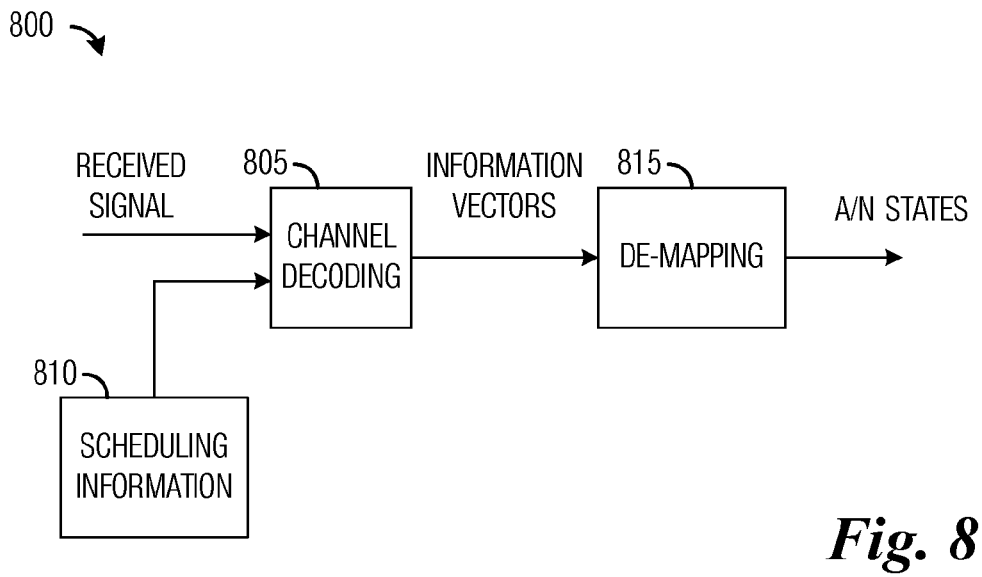
FIG. 8 is a diagram of information processing of ACK/ NACK information by an eNB.

FIG. 8 illustrates information processing 800 of ACK/NACK information by a communications device. Information processing 800 may be illustrative of processing of ACK/NACK information at a communications device, such as an eNB, that originally transmitted information resulting in the ACK/NACK information as the eNB processes ACK/NACK information received from a UE (a communications device that received the transmitted information from the eNB) for HARQ operation.

Figure 9:
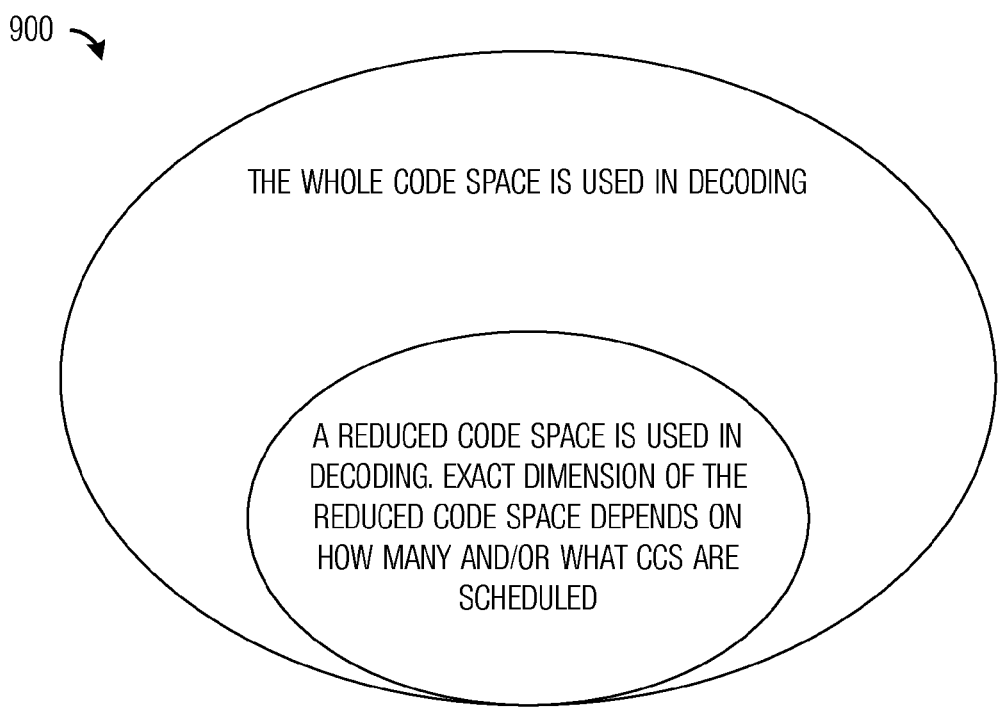
FIG. 9 is a diagram of a relationship of a whole code space and a reduced code space based on a priori knowledge of scheduled CCs.

The eNB may begin with a received signal received from the UE. According to an embodiment, the UE may transmit the signal to the eNB over a PUCCH. The received signal may include an encoded (and modulated) ACK/NACK information vector(s). The eNB may perform channel decoding 805 on the received signal. However, instead of performing channel decoding 805 over an entirety of a code space of the received signal, the eNB knows which CCs it scheduled (out of a configured CC set) and it may be able to potentially reduce the size of the code space of the received signal. Decoding the received signal in a smaller code space may simplify the decoding of the received signal. The eNB may make use of probability information 810, which is based on its a priori knowledge of which CCs have been scheduled. FIG. 9 illustrates a relationship 900 of a whole code space that is based on the configured CC set and a reduced code space based on a priori knowledge of scheduled CCs.

Returning now to FIG. 8, expurgating the (n, k) mother block code to a (n, k−$L_1$) block code implies that the code space is reduced from $2^k$ codewords to $2^{k-L_1}$ codewords. As $L_1$ increases, the number of possible codewords decreases exponentially. A decoder in the eNB may leverage this property to reduce the decoder complexity and improve decoding performance.

Since the eNB knows exactly which CCs are scheduled out of the configured CC set, the eNB can use the CC scheduling information as a priori knowledge for decoding an encoded ACK/NACK information vector carried on a PUCCH, where the encoded ACK/NACK information vector includes the joint ACK/NACK states. If the eNB doesn't transmit TBs to a UE on some CCs, a probability is close to one that ACK/NACK feedback corresponding to those CCs is DTX (or a combination NACK/DTX state). With the a priori information, the eNB may use an a priori probability of 100%, or slightly less than 100% (e.g., 90% or 95%), in its decoder implementation. An actual probability used in the decoder is an implementation issue and may be different depending on design and performance choices. The probability may be adjusted based on the performance requirement, depending on a false positive probability of the receiver's detection of the PDCCH, for example. A detailed description of channel decoding 805 is provided below.

After channel decoding 805 and producing a decoded ACK/NACK information vector, the decoded ACK/NACK information vector may undergo a de-mapping 815 to produce joint ACK/NACK states. De-mapping 815 may make use of mapping rule(s) that correspond to mapping rules used by the UE in its mapping of ACK/NACK states to the ACK/NACK information vector. The mapping rule(s) may be pre-specified or predefined. The eNB may then process the joint ACK/NACK states. For example, if there is a NACK corresponding to a CC and/or TB, the transmitter may schedule a retransmission on the CC and/or TB.

In general, the receiver will receive the encoded ACK/NACK information vectors and taking the scheduling information into account, that is if some CCs are not scheduled, then the corresponding bits will be set fixed values, the eNB will use the expurgated generator matrix to decode the encoded ACK/NACK information vectors. After which, the information bits will be de-mapped into the ACK/NACK feedbacks, is characterized by the generator matrix used for decoding.

For example, that the linear block code used for coding has a generator matrix selected from the plurality of generator matrices such that for a (n, 6) generator matrix, the expurgated generator matrices [v(1), v(2), v(3), v(4)], [v(3), v(4), v(5), v(6)], [v(1), v(2), v(5), v(6)] meet the maximum minimum distance requirement, which is n/2 when n is 48, 20, 32, 64, etc.

According to an embodiment, the (n, k) linear block code, where k>6, will include the (n, 6) linear block code as sub-code, in other word, the generator matrix for the (n, k) linear block code, where k>6, will include the generator matrix for the (n, 6) linear block code as defined previously. Additionally, the (n, k) linear block code, k>8, will include the (n, 8) linear block code as sub-code defined as defined previously. For example, for k=10, the generator matrix of the (n, k) linear block code, will include the generator matrix of the (n, 8) linear block code as defined previously as a sub-matrix. Furthermore, the linear block code at least includes the first order Reed-Muller code as sub-code except for the all "1" vector.

According to an embodiment, the eNB will use the IFHT to decode received signals, and then a one information bit transform is used to obtain the information bit contained in the received signals, wherein the information bit transform is the inverse transform of P between IFHT vectors and generator matrix used for linear block coding.

Figure 10:
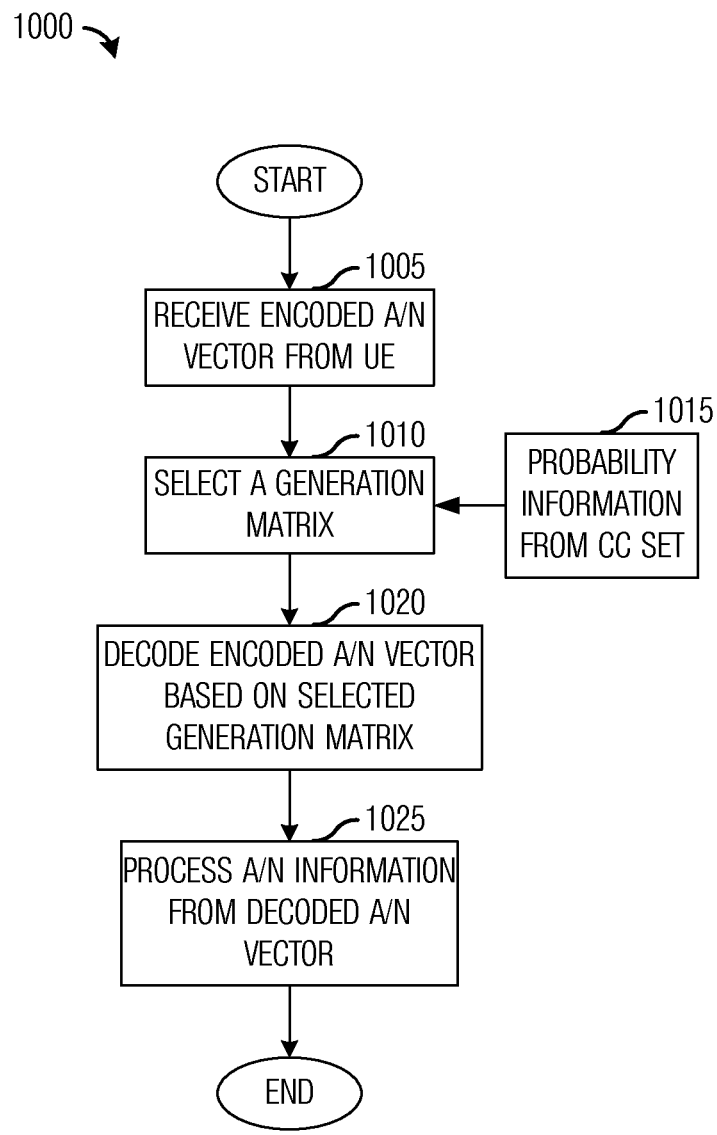
FIG. 10 is a flow diagram of eNB operations in transmitting information based on ACK/NACK information fed back to an eNB by a UE.

FIG. 10 illustrates a flow diagram of eNB operations 1000 in transmitting information based on ACK/NACK information fed back to an eNB by a UE. eNB operations 1000 may be indicative of operations occurring in an eNB as the eNB receives ACK/NACK information fed back to the eNB by a UE, and processes the ACK/NACK information. The ACK/NACK information received from the UE may have been encoded to help improve decoding performance. Additionally, the eNB may make use of a priori information to also help improve decoding performance. The eNB may transmit information to the UE based on the contents of the ACK/NACK information. eNB operations 1000 may occur while the eNB is in a normal operating mode.

eNB operations 1000 may begin with the eNB receiving a transmission from the UE, wherein the transmission includes an encoded ACK/NACK information vector (block 1005). The encoded ACK/NACK information vector includes ACK/NACK states for a previously transmission received by the UE and fed back by the UE. According to an embodiment, the ACK/NACK information vector may be encoded in such a way as to help improve the decoding performance of the eNB. As an example, if the ACK/NACK states fed back to the eNB includes CCs with the ACK/NACK state DTX, then one or more bits in the ACK/NACK information vector may be set to a fixed value prior to encoding.

The eNB may select a generator matrix (block 1010). According to an embodiment, the selection of the eNB may select the generator matrix from a plurality of generator matrices that may be provided by a technical specification, an operator of a communications system that includes the eNB, or so on. The plurality of generator matrices may include generator matrices for different numbers of configured CCs. Based on the a priori information known at the eNB regarding the set of configured CCs and the CCs in the set of configured CCs that are actually scheduled for transmission, such as the a priori probability information (block 1015), the eNB may select the generator matrix.

The eNB may then decode the encoded ACK/NACK information vector (block 1020). The eNB may make use of a linear block code specified by the selected generator matrix to decode the encoded ACK/NACK information vector.

After decoding the encoded ACK/NACK information vector in block 1020, the eNB may process ACK/NACK information contained in the decoded ACK/NACK information vector (block 1025). As an example, if the eNB received a NACK corresponding to a CC wherein the eNB transmitted information to the UE, then an error occurred and the eNB may need to retransmit the information. If the eNB received a NACK corresponding to a CC wherein the eNB did not transmit any information to the UE, then the UE likely determined that the CC had a DTX state. If the eNB received an ACK corresponding to a CC that it used to transmit to the UE, then the UE was able to correctly receive and error check the transmission. eNB operations 1000 may then terminate.

Figure 11:
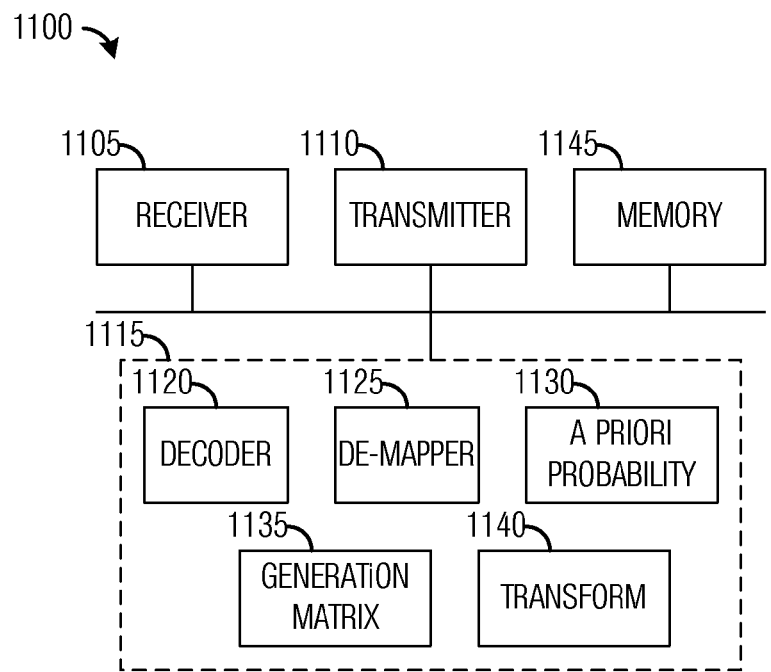
FIG. 11 is a diagram of an alternate illustration of a communications device.

FIG. 11 provides an alternate illustration of a communications device 1100. Communications device 1100 may be an implementation of an eNB. Communications device 1100 may be used to implement various ones of the embodiments discussed herein. As shown in FIG. 11, a receiver 1105 is configured to receive information (such as an encoded ACK/NACK information vector) and a transmitter 1110 is configured to transmit information. A decoder 1120 is configured to decode the ACK/NACK information vector and may make use of a priori information, such as a prior probabilities provided by an a priori probability unit 1130. Decoder 1120 is configured to decode using a linear block code decode that is based on a generator matrix. A de-mapper unit 1125 is configured to apply mapping rules to a decoded ACK/NACK probability vector to produce ACK/NACK states for transmissions made by communications device 1100. A priori probability unit 1130 is configured to compute the a priori probabilities based on a set of CCs allocated for use (i.e., a configured CC set) and actual CCs scheduled for use, which may be a subset of the configured CC set. A generator matrix unit 1135 is configured to select a generator matrix from a plurality of generator matrices based on a set of configured CCs and a set of CC from the set of configured CCs actually used to transmit information. A transform unit 1140 is configured to transform the ACK/NACK information vector. A memory 1145 is configured to store information, as well as mapping rules, a priori probabilities, configured CC set, actual CCs scheduled, the plurality of generator matrices, and so on.

The elements of communications device 1100 may be implemented as specific hardware logic blocks. In an alternative, the elements of communications device 1100 may be implemented as software executing in a processor, controller, application specific integrated circuit, or so on. In yet another alternative, the elements of communications device 1100 may be implemented as a combination of software and/or hardware.

As an example, receiver 1105 and transmitter 1110 may be implemented as a specific hardware block, while decoder 1120, de-mapper 1125, a priori probability unit 1130, generator matrix unit 1135, and transform unit 1140 may be software modules executing in a microprocessor (such as processor 1115) or a custom circuit or a custom compiled logic array of a field programmable logic array.

According to an embodiment, the eNB will receive the encoded ACK/NACK information vectors and the taking the scheduling information into consideration (that is if some CCs are not scheduled, then the corresponding bits will be set fixed values) the eNB will use the expurgated generator matrix to decode the received encoded ACK/NACK information vectors. After that, the information bits will be de-mapped into the ACK/NACK/DTX information, which is characterized by the generator matrix has the properties discussed herein.

Figure 12:
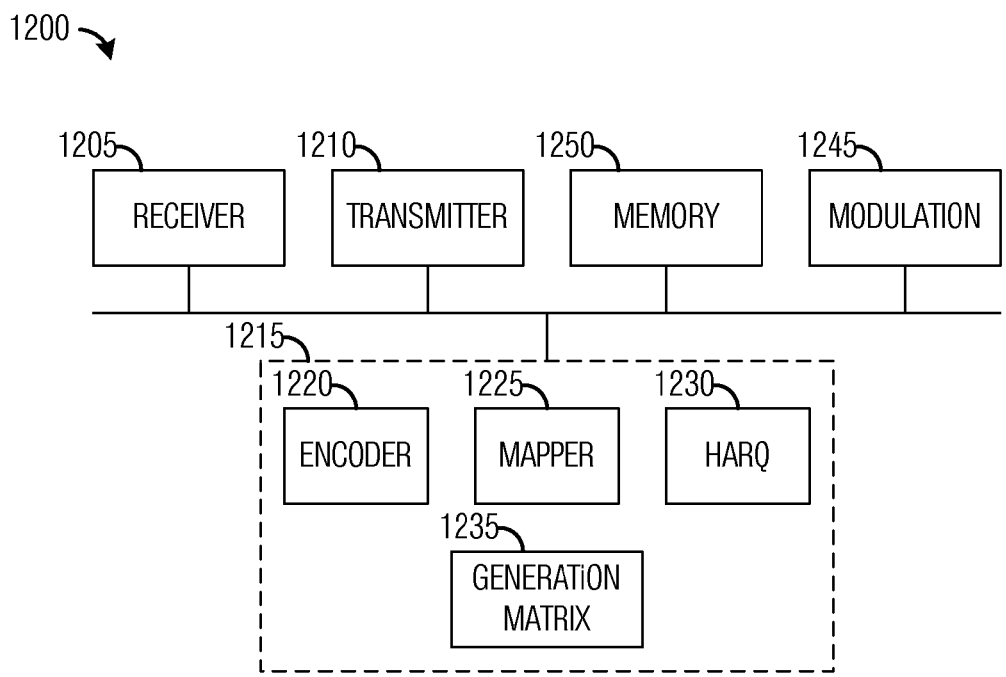
FIG. 12 is a diagram of an alternate illustration of a communications device.

FIG. 12 provides an alternate illustration of a communications device 1200. Communications device 1200 may be an implementation of a UE. Communications device 1200 may be used to implement various ones of the embodiments discussed herein. As shown in FIG. 12, a receiver 1205 is configured to receive information and a transmitter 1210 is configured to transmit information (such as an encoded ACK/NACK information vector). An encoder 1220 is configured to encode the ACK/NACK information vector using a linear block code as specified by a generator matrix, for example. Mapper unit 1225 is configured to map individual ACK/NACK states into an ACK/NACK information vector using mapping rules. A generator matrix unit 1235 is configured to select a generator matrix for use in encoding the ACK/NACK information vector(s) based on a set of configured CCs. A HARQ unit 1230 is configured to determine HARQ responses for transmissions received or not received at communications device 1200. A modulation unit 1245 is configured to modulate an encoded ACK/NACK information vector for transmission purposes. A memory 1250 is configured to store information, as well as mapping rules, and so on.

The elements of communications device 1200 may be implemented as specific hardware logic blocks. In an alternative, the elements of communications device 1200 may be implemented as software executing in a processor, controller, application specific integrated circuit, or so on. In yet another alternative, the elements of communications device 1200 may be implemented as a combination of software and/or hardware.

As an example, receiver 1205 and transmitter 1210 may be implemented as a specific hardware block, while encoder 1220, mapper unit 1225, HARQ unit 1230, and generator matrix unit 1235 may be software modules executing in a microprocessor (such as processor 1215) or a custom circuit or a custom compiled logic array of a field programmable logic array. Similarly, modulation unit 1245 may be implemented as a specific hardware block or a software module in a processor or a custom circuit or a custom compiled logic array of a field programmable logic array.

According to an embodiment, the UE will transmit multiple ACK/NACK feedbacks with the ACK/NACK feedbacks first being mapped into the ACK/NACK information bits, then with a linear block code, the ACK/NACK information bits are mapped into the code word to be transmitted in the UL control channel. The encoding is characterized by the mapping from ACK/NACK feedbacks to the code word satisfying the property that the generator matrix has the properties discussed herein.

Any equivalent transformation of the generator matrix to keep the best minimum distance property can be used to generate an essentially identical generator matrix. Exemplary transformations include the addition of one code word vector to the generator vectors. Equivalent transformations include the transformation within the two vectors corresponding to one CC, as well as permutations among vectors.

First selecting a number, such as four, of vectors from the code word spaces that have the best minimum distance property, for example, [4, 2, 5, 6], in other words, the code defined by [4, 2], [5, 6], [4, 2, 5, 6] all have the minimum distance not less than 24 in case of the (48, A) linear block code, 10 in case of the (20, A) linear block code. Then, linear combination of vector 5, vector 6 to be added to vector 1, and vector 3, such that the linear vectors [4, 2, 1+<5, 6>, 3+<5, 6>], where <5, 6> may represent any of 5, 6, 5+6, or zero vector, in other words, <5, 6> may represent linear combinations of vector 5 and vector 6.

Then a new generator matrix $[a_1, a_2, a_3, a_4, a_5, a_6]$ is found such that [1, 2, 3, 4], [1, 2, 5, 6] both have the best minimum distance property. Then the set of [3, 4, 5+<1, 2>, 6+<1, 2>] is searched in order to find vectors such that [1, 2, 3, 4, 5+<1, 2>, 6+<1, 2>] has the best minimum distance property when expurgated. For example, the (48, 6) linear block code 1, and the (48, 6) linear block code 2.

Another alternative is to search from generator matrix [3+<1, 2>, 4+<1, 2>, 5, 6]. With this generator matrix, a threshold may be used to stop the search even if a generator matrix with best minimum distance property has not yet been found. For example, the number of code word generated by expurgated code, having the weight less than x, should not be more than y, where x, y are usually selected thresholds, and may be positive integers, x>=the minimum distance of the not expurgated (n, k) linear block code and y is an integer which can be 1, 2, . . . 3, etc.

The new generator matrix at least satisfies the property that when any two CCs are scheduled, the minimum distance of expurgated matrix should have not be less than n/2, where n is even. Examples for (n, 6) and (n, 8) linear block codes, where n=48 and 20 when three or four CCs are configured, have been shown.

Advantageous features of embodiments of the invention may include: a mapping method from ACK/NACK information to the code words of a (n, k) linear block code is characterized by the generator matrix of the linear block code has the best minimum distance property for expurgated generator matrix corresponding to only p CCs are scheduled, the expurgated generator matrix corresponds to the transport blocks of those p CCs that are scheduled, where p is an integer. The best minimum distance property is defined by the minimum distance of the code word generated by the generator matrix reaching the upper bound of the minimum distance of linear block codes with the same code word length and information bit vector length.

The method could further include, the linear block code at least includes the first order Reed-Muller code as sub-code except the all "1" vector. Furthermore, the linear block code includes first order Reed-Muller code as sub-code.

The method could further include, generator matrices for n=20, 48, 32, and 64, k=6, and 8, where n is the length of code words, and k is the length of information bit vector.

The method could further include, a generator matrix for scheduling P CCs that doesn't have the best minimum distance property, such as when CCs $i_1, i_2, \ldots, i_p$ are scheduled, where $i_1 < i_2 < \ldots < i_p$ are the indices of p CCs.

The method could further include, there is a predefined invertible linear transform matrix P to transform the generator vectors of first order Reed-Muller code $v_1, v_2, \ldots, v_m$ into new generator vectors $w_1, w_2, \ldots, w_m$, where m is the number of generator vectors of first order Reed-Muller code, and remaining k−m generator vectors are chosen to make the generator matrix for the (n, k) linear block code to have the minimum distance property such that the expurgated generator matrixes with q vectors corresponding to p CCs and/or subframes (in the case of dual transport block transmission, q=2·p vectors) are scheduled have the larger minimum distances than the code word space of (n, k) code words, where p<k and is an integer. The predefined invertible linear transform matrix P is an invertible n×n matrix to transform the generator vectors $[v_1, v_2, \ldots, v_n]$ to generator vectors $[w_1, w_2, \ldots, w_n]$. Generally there are q vectors corresponding to the q transport blocks of those p CCs.

The method could further include, a method for ACK/NACK information decoding with the expurgated generator matrix, characterized by the generator matrix of the linear block code having the best minimum distance property or the larger minimum distance property for expurgated generator matrix corresponding to only part of configured CCs are scheduled.

The method could further include, a method for ACK/NACK information decoding, the decoding is characterized by apply a transform $P^{-1}$ to the signal to be processed after an IFHT, where $P^{-1}$ is the inverse transform of P, and P is the transform applied to the vectors of first order Reed-Muller code.

Advantageous features of embodiments of the invention may include: a mapping method from ACK/NACK information to codeword of a (n, k) linear block code, wherein a matrix of the linear block code is generated having the best minimum distance property for expurgated generator matrix corresponding to only part of configured CCs are scheduled, the linear block code having at least the first order Reed-Muller code as sub-code except the all "1" vector.

The method could further include, wherein n=20, and 48, and k=6.

Advantageous features of embodiments of the invention may include: a decoding method for ACK/NACK information decoding with an expurgated generator matrix, wherein a matrix of the linear block code is generated having the best minimum distance property for expurgated generator matrix is scheduled corresponding to only part of a set of configured CCs.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for communications device operations, the method comprising:
   determining a hybrid automatic repeat request (HARQ) response for each component carrier (CC) in a set of configured CCs, thereby producing a set of HARQ responses;
   generating an information vector from the set of HARQ responses, wherein a unique set of bits selected from the information vector is assigned to represent a HARQ response for each different CC in the set of configured CCs;
   encoding the information vector based on a (n, k) linear block code corresponding to the set of configured CCs, wherein the (n, k) linear block code is obtained by a linear transformation of an original (n, k) linear block code, where n is a length of code words, and k is a length of information vectors with k; and
   transmitting the encoded information vector,
   wherein a code word space generated by an expurgated (n, k') linear block code has a larger minimum distance when a subset of the set of configured CCs are scheduled than when all CCs of the set of configured CCs are scheduled, regardless of which subset of the set of configured CCs are scheduled, where k'<k.

2. The method of claim 1, further comprising selecting a generator matrix of the (n, k) linear block code from a plurality of generator matrices, each obtained via linear transformation of an original (n, k) linear block code.

3. The method of claim 2, wherein the generator matrix is selected from the plurality of generator matrices based on the set of configured CCs.

4. The method of claim 2, wherein the plurality of generator matrices are prespecified.

5. The method of claim 1, wherein the (n, k) linear block code comprises a first order Reed-Muller linear block code as a sub-code, or the (n, k) linear block code comprises a punctured or repeated first order Reed-Muller linear block code as a sub-code.

6. A method for communications device operations, the method comprising:
   determining a hybrid automatic repeat request (HARQ) response for each component carrier (CC) in a set of configured CCs, thereby producing a set of HARQ responses;
   generating an information vector from the set of HARQ responses, wherein a unique set of bits selected from the information vector is assigned to represent a HARQ response for each different CC in the set of configured CCs;
   encoding the information vector based on a (n, k) linear block code corresponding to the set of configured CCs, wherein the (n, k) linear block code is obtained by a linear transformation of an original (n, k) linear block code, where n is a length of code words, and k is a length of information vectors with k;
   transmitting the encoded information vector; and
   linearly transforming m generator vectors of a first order Reed-Muller linear block code to generate m generator vectors of a generator matrix of the (n, k) linear block code, or transforming m generator vectors of the punctured or repeated first order Reed-Muller linear block code to generate m generator vectors of the generator matrix of the (n, k) linear block code, where m is an integer value, wherein the (n, k) linear block code comprises the first order Reed-Muller linear block code as a sub-code, or the (n, k) linear block code comprises a punctured or repeated first order Reed-Muller linear block code as a sub-code.

7. The method of claim 6, further comprising choosing k−m vectors of the generator matrix of the (n, k) linear block code so that the generator matrix meets a minimum distance property.

8. A method for communications device operations, the method comprising:
  decoding a received encoded information vector based on a generator matrix for a (n, k) linear block code, wherein the encoded information vector comprises a hybrid automatic repeat request (HARQ) response for a previous data transmission from the communication device over a plurality of configured component carriers (CCs), wherein the decoding makes use of a priori information about a subset of CCs from a set of configured CCs used to transmit information from the communications device, thereby producing an information vector, and wherein the (n, k) linear block code is obtained by linear transformation of an original (n, k) linear block code, where n is a length of code words, and k is a length of information bit vector; and
  generating individual HARQ responses from the information vector,
  wherein a code word space generated by an expurgated (n, k') linear block code has a larger minimum distance when a subset of the set of configured CCs are scheduled than when all CCs of the set of configured CCs are scheduled, regardless of which subset of the set of configured CCs are scheduled, where k'<k.

9. The method of claim 8, further comprising selecting the generator matrix of the (n, k) linear block code from a plurality of generator matrices based on the set of configured CCs.

10. The method of claim 9, wherein the plurality of generator matrices are stored in a memory.

11. The method of claim 8, wherein the decoding comprises applying an inverse linear transformation of the received encoded information vector, thereby producing a transformed received encoded information vector.

12. The method of claim 11, wherein the inverse transform comprises an inverse fast hadamard transform.

13. The method of claim 11, further comprising transforming the transformed received encoded information vector.

14. The method of claim 13, wherein transforming the transformed received encoded information vector comprises an inverse of a transform applied to an encoded information vector at a transmitter of the encoded information vector.

15. A communications device comprising:
  a response unit configured to determine a hybrid automatic repeat request (HARQ) response for each transport block (TB) of each component carrier (CC) in a set of configured CCs assigned to the communications device;
  a mapper coupled to the response unit, the mapper configured to generate an information vector from HARQ responses produced by the response unit and the set of configured CCs, wherein a unique set of bits selected from the information vector is assigned to represent HARQ response for each different CC in the set of configured CCs; and
  an encoder coupled to the mapper, the encoder configured to encode the information vector based on a generator matrix for a (n, k) linear block code, which is obtained by linear transformation of an original (n, k) linear block code where n is a length of code words, and k is a length of information bit vector,
  wherein a code word space generated by an expurgated (n, k') linear block code has a larger minimum distance when a subset of the set of configured CCs are scheduled than when all CCs of the set of configured CCs are scheduled, regardless of which subset of the set of configured CCs are scheduled, where k'<k.

16. The communications device of claim 15, further comprising a selector unit coupled to the encoder and to the mapper, the selector unit configured to select the generator matrix from a plurality of generator matrices based on the set of configured CCs.

17. The communications device of claim 15, wherein the (n, k) linear block code comprises a first order Reed-Muller linear block code as a sub-code, or the (n, k) linear block code comprises a punctured or repeated first order Reed-Muller linear block code as a sub-code.

18. A communications device comprising:
  a decoder configured to be coupled to an information source and to decode an encoded information vector provided by the information source based on a (n, k) linear block code, wherein the (n, k) linear block code is obtained from an original (n, k) linear block code, where n is a length of code words, and k is a length of information bit vector, wherein the decoder makes use of a priori information about a subset of component carriers (CCs) used to transmit information;
  a generator coupled to the decoder, the generator configured to produce individual hybrid automatic repeat requested (HARQ) responses from an output of the decoder; and
  a processor coupled to the generator, the processor configured to process each of the individual HARQ responses,
  wherein a code word space generated by an expurgated (n, k') linear block code has a larger minimum distance when a subset of the set of configured CCs are scheduled than when all CCs of the set of configured CCs are scheduled, regardless of which subset of the set of configured CCs are scheduled, where k'<k.

19. The communications device of claim 18, further comprising a selector unit coupled to the decoder, the selector unit configured to select a generator matrix from a plurality of generator matrices based on a set of configured CCs.

20. The communications device of claim 18, further comprising a transform unit coupled to the information source, the transform unit configured to transform the encoded information vector.

21. A method for communications device operations, the method comprising:
  generating an information vector that represents a hybrid automatic repeat requested acknowledgement (HARQ-ACK) response of transport blocks on each configured component carrier, wherein two information bits are used to represent the HARQ-ACK response of a single transport block;
  encoding the information vector, wherein the encoding is based on two linear block codes; and
  transmitting the encoded information vector, wherein the two information bits used to represent the HARQ-ACK response of a single transport block are obtained by mapping an acknowledgement/negative acknowledgement (ACK/NACK) state of a single transport block into two ACK/NACK states selected from a set of ACK/NACK states for dual transport blocks, wherein the ACK/NACK state of a single transport block comprises {ACK or NACK} states, and wherein the set of ACK/NACK states for dual transport blocks comprises {(ACK, ACK), (ACK, NACK), (NACK, ACK), (NACK, NACK)}, and wherein an ACK state is mapped into (ACK, ACK) and a NACK state is mapped into (NACK, NACK), and the two information bits corresponding to a component carrier are encoded with separate linear block codes, wherein a code word space generated by an expurgated (n, k') linear block code has a larger minimum distance when a subset of the set of configured CCs are scheduled than when all CCs of the set of configured CCs are scheduled, regardless of which subset of the set of configured CCs are scheduled, where $k'<k$.

22. The method of claim 21, wherein the two linear block codes comprise Reed-Muller linear block codes.

* * * * *

UNITED STATES PATENT AND TRADEMARK OFFICE
CERTIFICATE OF CORRECTION

PATENT NO. : 8,537,787 B2  
APPLICATION NO. : 13/023338  
DATED : September 17, 2013  
INVENTOR(S) : Qu et al.

Page 1 of 1

It is certified that error appears in the above-identified patent and that said Letters Patent is hereby corrected as shown below:

On the Title Page, Item [73] Assignee, delete "FutueWei" and insert --FutureWei--.

In the Claims  
Col. 39, line 19, claim 8, delete "priori" and insert --*priori*--.  
Col. 40, line 28, claim 18, delete "priori" and insert --*priori*--.

Signed and Sealed this  
Twelfth Day of November, 2013

Teresa Stanek Rea  
*Deputy Director of the United States Patent and Trademark Office*